(12) United States Patent
Heo et al.

(10) Patent No.: US 11,393,798 B2
(45) Date of Patent: Jul. 19, 2022

(54) DISPLAY DEVICE

(71) Applicant: Samsung Display Co., LTD., Yongin-si (KR)

(72) Inventors: Eui Kang Heo, Seoul (KR); Chong Sup Chang, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 135 days.

(21) Appl. No.: 16/916,995

(22) Filed: Jun. 30, 2020

(65) Prior Publication Data

US 2021/0091050 A1    Mar. 25, 2021

(30) Foreign Application Priority Data

Sep. 23, 2019  (KR) .......................... 10-2019-0116610

(51) Int. Cl.
| | | |
|---|---|---|
| *H01L 25/075* | (2006.01) | |
| *H01L 33/62* | (2010.01) | |
| *H01L 27/12* | (2006.01) | |

(52) U.S. Cl.
CPC ...... *H01L 25/0753* (2013.01); *H01L 27/1214* (2013.01); *H01L 33/62* (2013.01)

(58) Field of Classification Search
CPC . H01L 25/0753; H01L 27/1214; H01L 33/62; H01L 25/167; H01L 29/78648; H01L 33/20; H01L 33/44; H01L 27/156; H01L 21/76895; H01L 33/02; H01L 33/36
See application file for complete search history.

(56) References Cited

U.S. PATENT DOCUMENTS

| | | | | |
|---|---|---|---|---|
| 2018/0019426 A1* | 1/2018 | Im | ........................ | H01L 25/0753 |
| 2018/0175009 A1* | 6/2018 | Kim | ..................... | H01L 27/156 |
| 2018/0175106 A1* | 6/2018 | Kim | ..................... | H01L 33/20 |
| 2019/0244567 A1* | 8/2019 | Cho | ..................... | H01L 25/167 |
| 2019/0244985 A1* | 8/2019 | Kim | ..................... | H01L 33/387 |
| 2019/0251898 A1* | 8/2019 | Cho | ..................... | H01L 25/167 |
| 2019/0319168 A1* | 10/2019 | Kim | ..................... | H01L 27/3218 |
| 2020/0005703 A1* | 1/2020 | Kim | ..................... | G09G 3/32 |
| 2020/0013766 A1* | 1/2020 | Kim | ..................... | H01L 25/167 |
| 2020/0075814 A1* | 3/2020 | Park | ..................... | H01L 33/502 |
| 2020/0135089 A1* | 4/2020 | Ji | ..................... | H01L 33/62 |
| 2020/0144453 A1* | 5/2020 | Chang | ..................... | H01L 33/38 |
| 2020/0152835 A1* | 5/2020 | Ko | ..................... | H01L 33/38 |
| 2020/0168662 A1* | 5/2020 | Kim | ..................... | H01L 27/124 |
| 2020/0203587 A1* | 6/2020 | Kim | ..................... | H01L 25/0753 |

(Continued)

FOREIGN PATENT DOCUMENTS

| | | |
|---|---|---|
| KR | 10-2018-0072909 | 7/2018 |
| KR | 10-2020-0123900 | 11/2020 |
| WO | 2020/218722 | 10/2020 |

*Primary Examiner* — Victor A Mandala
(74) *Attorney, Agent, or Firm* — Kile Park Reed & Houtteman PLLC

(57) ABSTRACT

A display device includes a first electrode and a second electrode disposed on a substrate and spaced apart from each other, a first light emitting element disposed between the first electrode and the second electrode, a second light emitting element disposed on the first electrode and spaced apart from the first light emitting element, and an insulating layer disposed on the first electrode and overlapping the second light emitting element. The insulating layer includes at least one contact hole which penetrates the insulating layer to expose a part of the first electrode.

21 Claims, 18 Drawing Sheets

(56) References Cited

U.S. PATENT DOCUMENTS

| | | | |
|---|---|---|---|
| 2020/0258938 A1* | 8/2020 | Chai | H01L 33/62 |
| 2020/0273906 A1* | 8/2020 | Li | H01L 33/38 |
| 2021/0159250 A1* | 5/2021 | Chang | G09G 3/3233 |
| 2021/0167050 A1* | 6/2021 | Cho | H01L 25/0753 |
| 2021/0167253 A1* | 6/2021 | Basrur | H01L 33/405 |
| 2021/0202450 A1* | 7/2021 | Min | H01L 33/44 |

* cited by examiner

FIG. 1
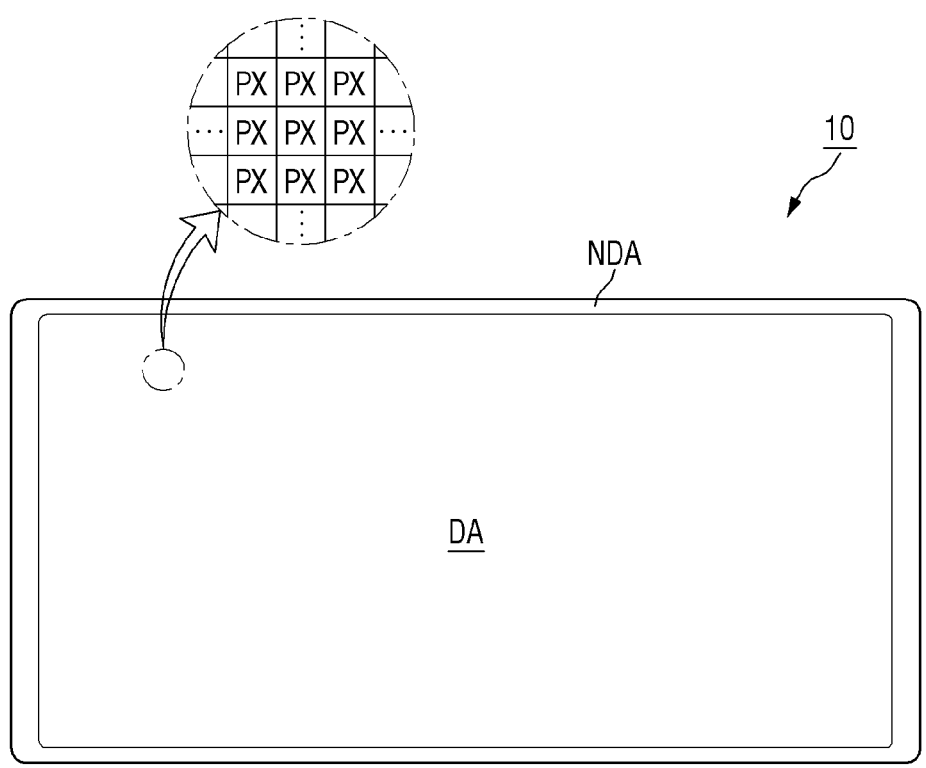
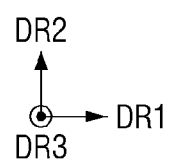

300: 310, 320, 330, 370, 380

DISPLAY DEVICE

CROSS REFERENCE TO RELATED APPLICATION(S)

This application claims the benefit of Korean Patent Application No. 10-2019-0116610 under 35 U.S.C. § 119, filed in the Korean Intellectual Property Office on Sep. 23, 2019, the entire contents of which are incorporated herein by reference.

BACKGROUND

1. Technical Field

The disclosure relates to a display device, and to a display device having light emitting elements.

2. Description of the Related Art

Display devices are becoming more important as the development of multimedia is progressed. Various types of display devices have been developed such as organic light emitting displays and liquid crystal displays.

In general, a display device for displaying an image includes a display panel such as an organic light emitting display panel or a liquid crystal display panel. A light emitting display panel may include light emitting elements such as light emitting diodes (LEDs). For example, the LEDs may be organic light emitting diodes (OLEDs) using an organic material as a fluorescent material or may be inorganic LEDs using an inorganic material as a fluorescent material.

Inorganic LEDs using an inorganic semiconductor as a fluorescent material are durable even in a high-temperature environment and have higher blue light efficiency than OLEDs. A transfer method using dielectrophoresis (DEP) has been developed for manufacturing of the inorganic LEDs. Also, further research have been and are continuously contributed for development of the inorganic LEDs which have better durability and efficiency than OLEDs.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device in which some light emitting elements may be disposed on an electrode or in an area other than a space in which the electrodes face each other, but loss of such light emitting elements may be prevented during a manufacturing process.

However, embodiments of the disclosure are not limited to those set forth herein. The embodiments will become more apparent to one of ordinary skill in the art to which the disclosure pertains by referencing the detailed description given below.

A display device may include a first electrode and a second electrode disposed on a substrate and spaced apart from each other, a first light emitting element disposed between the first electrode and the second electrode, a second light emitting element disposed on the first electrode and spaced apart from the first light emitting element, and an insulating layer disposed on the first electrode and overlapping the second light emitting element. The insulating layer may include at least one contact hole which penetrates the insulating layer to expose a part of the first electrode.

In an embodiment, a length of the second light emitting element may be greater than a diameter of the at least one contact hole.

In an embodiment, the at least one contact hole includes multiple contact holes, and at least part of the multiple contact holes may overlap the second light emitting element.

In an embodiment, the second light emitting element may be electrically connected with the first electrode.

In an embodiment, at least part of the second light emitting element may directly contact the first electrode.

In an embodiment, the first light emitting element may be electrically connected to the first electrode and the second electrode, and the second light emitting element may not be electrically connected to the second electrode.

In an embodiment, the display device may include a first contact electrode electrically connected with an end of the first light emitting element and the first electrode, and a second contact electrode electrically connected with another end of the first light emitting element and the second electrode, wherein the first contact electrode may be electrically connected with the first electrode through the at least one contact hole.

In an embodiment, the second light emitting element may include an end electrically connected with the first contact electrode, and another end contacting the insulating layer.

In an embodiment, the first electrode may include a side facing the second electrode and another side opposite to the side, a third light emitting element disposed at the another side of the first electrode, and the insulating layer may overlap the third light emitting element.

In an embodiment, the third light emitting element may not be electrically connected to the first electrode and the second electrode.

A display device may include a first electrode and a second electrode disposed on a substrate and spaced apart from each other, a first insulating layer overlapping at least part of each of the first electrode and the second electrode, a first light emitting element disposed between the first electrode and the second electrode, a second light emitting element disposed on the first electrode and spaced apart from the first light emitting element, a second insulating layer disposed on the first electrode and overlapping the second light emitting element, the second insulating layer comprising at least one first contact hole which penetrates the second insulating layer to expose a part of the first electrode, and a third insulating layer disposed on the first light emitting element and exposing at least part of the first light emitting element.

In an embodiment, the display device may include a first contact electrode electrically connected with an end of the first light emitting element and the first electrode, and a second contact electrode electrically connected with another end of the first light emitting element and the second electrode.

In an embodiment, the second insulating layer may further include at least one second contact hole which penetrates the second insulating layer to expose at least part of the second light emitting element.

In an embodiment, a length of the second light emitting element may be greater than a diameter of the at least one second contact hole.

In an embodiment, the first insulating layer may be disposed between the first electrode and the second electrode, and the first light emitting element may be disposed on the first insulating layer.

In an embodiment, at least part of the first insulating layer may be disposed on the first electrode, and the second light emitting element may be disposed on the first electrode.

In an embodiment, the at least one first contact hole may penetrate the first insulating layer to expose a part of the first electrode.

In an embodiment, the second insulating layer may be spaced apart from the first insulating layer.

In an embodiment, the second insulating layer may contact at least part of the first insulating layer.

In an embodiment, the first electrode may include a side facing the second electrode and another side opposite to the side, a third light emitting element may be disposed at the another side of the first electrode, and the second insulating layer may overlap the third light emitting element.

In an embodiment, the third light emitting element may not be electrically connected to the first electrode and the second electrode.

A display device may include a third insulating layer disposed on first light emitting elements and may further include a second insulating layer disposed on second light emitting elements and third light emitting elements, thereby preventing the light emitting elements from being lost during a manufacturing process of the display device.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

These and/or other aspects will become apparent and more readily appreciated from the following description of the embodiments, taken in conjunction with the accompanying drawings in which:

FIG. 1 is a schematic plan view of a display device according to an embodiment;

DETAILED DESCRIPTION OF THE EMBODIMENTS

Figure 2:
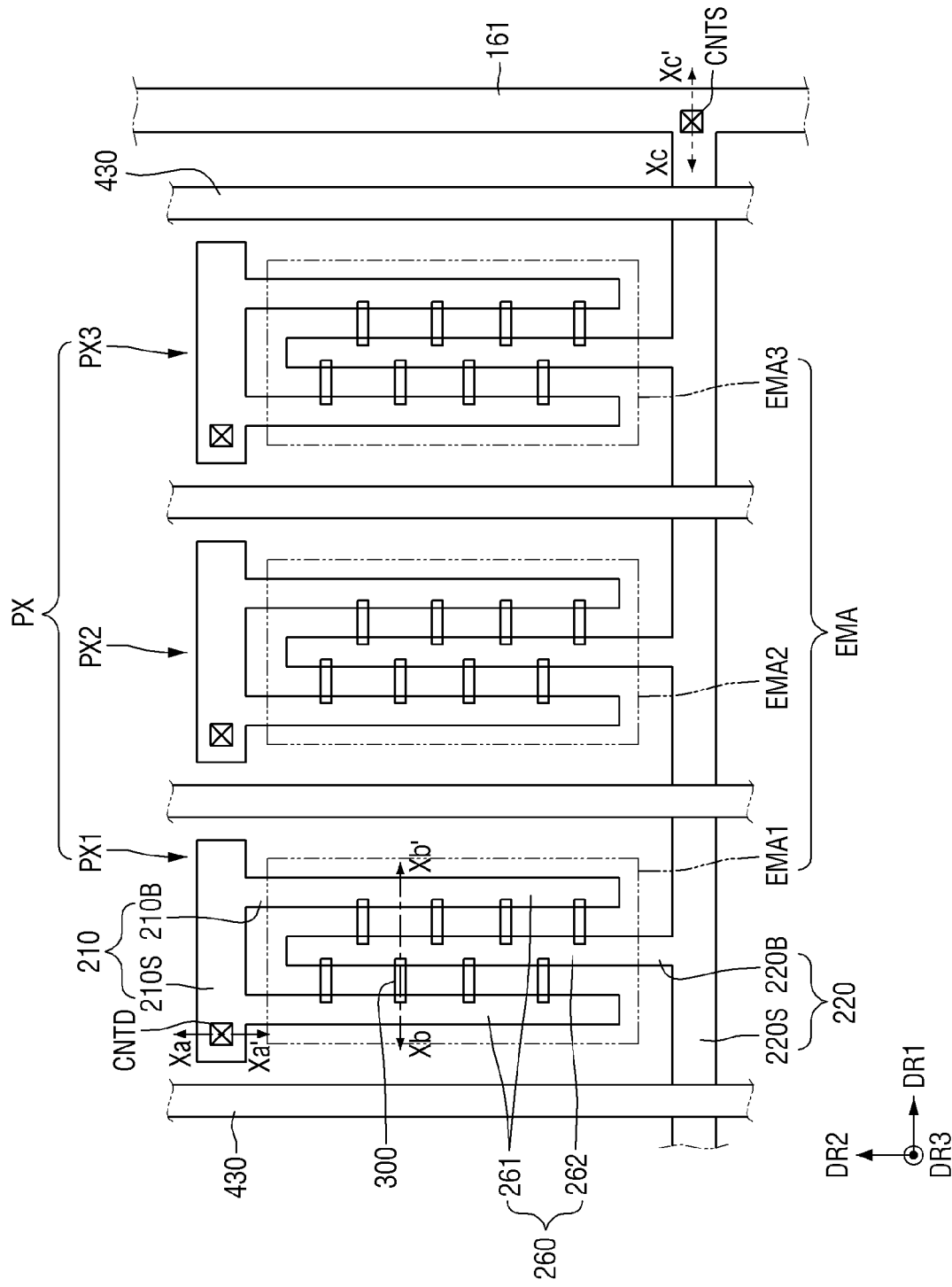
FIG. 2 is a schematic plan view of one pixel of the display device according to an embodiment.

The embodiments will be described hereinafter with reference to the accompanying drawings, in which the embodiments are shown. This invention may, however, be embodied in varying or modified forms and should not be construed as limited to the embodiments set forth herein. Rather, the embodiments are provided so that this disclosure will be thorough and complete, and will fully convey the scope of the invention to those skilled in the art.

The same reference numbers indicate the same components throughout the specification. The same or like elements are identified by the same reference characters through the specification.

Hereinafter, embodiments of the disclosure will be described with reference to the drawings. When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

It will be understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value. Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

The term "overlap" may include layer, stack, face or facing, extending over, covering, or partly covering, abut, or any other suitable term as would be appreciated and understood by those of ordinary skill in the art. The expression "do not overlap" may include "apart from" or "set aside from" or "offset from" and any other suitable equivalents as would be appreciated and understood by those of ordinary skill in the art.

FIG. 1 is a schematic plan view of a display device 10 according to an embodiment.

Referring to FIG. 1, the display device 10 displays moving images or still images. The display device 10 may be any electronic device that provides a display screen. Examples of the display device 10 may include televisions, notebook computers, monitors, billboards, the Internet of things (IoT), mobile phones, smartphones, tablet personal computers (PCs), electronic watches; smart watches; watch phones, head mounted displays, mobile communication terminals, electronic notebooks, electronic books, portable multimedia players (PNIPs), navigation devices, game machines, digital cameras, an automotive display, and camcorders, which provide a display screen.

The display device 10 may include a display panel that provides a display screen. Examples of the display panel include light emitting diode (LED) display panels, organic light emitting display panels, quantum dot light emitting display panels, nano emitting display panels, plasma display panels, and field emission display panels. The below description is directed to a case where an LED display panel is applied as an example of the display panel. However, the embodiments and the disclosure are not limited thereto. In other embodiments, other display panels can be applied within the same or similar technical aspects of the disclosure.

In the description, a first direction DR1, a second direction DR2, and a third direction DR3 are defined as shown in the drawings. The first direction DR1 and the second direction DR2 may be directions perpendicular to each other in a same plane. The third direction DR3 may be a direction perpendicular to the plane of the first direction DR1 and the second direction DR2. The third direction DR3 may be perpendicular to each of the first direction DR1 and the second direction DR2. In embodiments, the third direction DR3 may indicate a thickness direction of the display device 10.

The shape of the display device 10 can be variously modified. For example, the display device 10 may be shaped like a rectangle that is longer in the first direction DR1 than in the second direction DR2. A display surface of the display device 10 may be disposed on a first side of the display device 10 in the third direction DR3 (or the thickness direction). In the description, the term "above" indicates a disposition of a component/element closer or toward to the first side (or the display surface) in the third direction DR3, which may refer to as a display direction. An upper surface indicates a surface facing or toward the first side of the display device 10 in the third direction DR3. In addition, the term "below" indicates a disposition of a component/element closer or toward to a second side of the display device 10 in the third direction DR3, i.e., a direction opposite to the display direction. A lower surface indicates a surface facing or toward the second side of the display device in the third direction DR3. The display device 10 may have various shapes such as a rectangle with its length in the first direction DR1, a rectangle with its length in the second direction DR2, a square, a quadrilateral with rounded corners (vertices), other polygons, or a circle.

The display device 10 may include a display area DA and a non-display area NDA. The display area DA may be an area where an image may be displayed, and the non-display area NDA may be an area where no image is displayed. The display area DA may also be referred to as an active area, and the non-display area NDA may also be referred to as an inactive area.

The shape of the display area DA of the display device 10 may have a similar shape as that of the display device 10. For example, when the display device 10 has a rectangular planar shape that is longer in the first direction DR1 than in the second direction DR2, the display area DA may also have a similar rectangular planar shape.

The display area DA may be disposed or positioned at a center of the display device 10. The display area DA may include multiple pixels PX. The pixels PX may be arranged in a matrix direction. Each of the pixels PX may be rectangular or square in a plan view. However, the shape of each of the pixels PX is not limited to these examples and may also be a rhombic shape having each side inclined with respect to one direction. Each pixel PX may include one or more light emitting elements 300 which emit light of a particular (or predetermined) wavelength band to display a particular (or predetermined) color.

Figure 3:
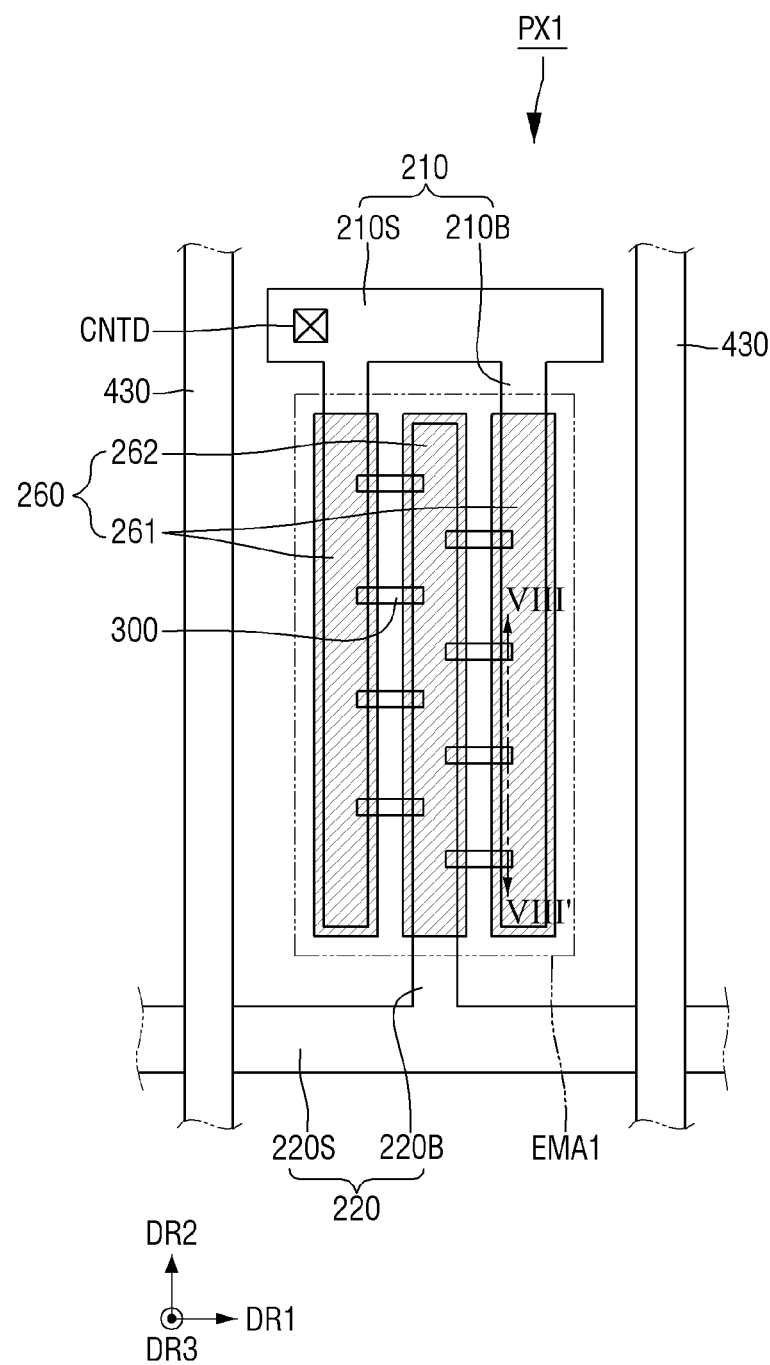
FIG. 3 is a schematic plan view of one subpixel of FIG. 2.

FIG. 2 is a schematic plan view of a pixel PX of the display device 10 according to an embodiment. FIG. 3 is a schematic plan view of a subpixel of FIG. 2.

Referring to FIGS. 2 and 3, each of the pixels PX may include multiple subpixels PXn. Each of the pixels PX may include a first subpixel PX1, a second subpixel PX2, and a third subpixel PX3. Although the pixel PX shown in FIG. 2 includes the three subpixels PX1, PX2 and PX3, the number of subpixels PXn is not limited thereto. In other embodiments, a pixel PX may include more than three subpixels PXn.

Each subpixel PXn may include one or more light emitting elements 300 which emit light of a particular (or predetermined) wavelength band to emit light of a particular (or predetermined) color. The first subpixel PX1 may emit light of a first color, the second subpixel PX2 may emit light of a second color, and the third subpixel PX3 may emit light of a third color. The second color of the light emitted by the second subpixel PX2 may be different from the first color of the light emitted by the first subpixel PX1, and the third color of the light emitted by the third subpixel PX3 may be different from the first color of the light emitted by the first subpixel PX1 and the second color of the light emitted by the second subpixel PX2. However, the embodiments are not limited to this configuration. In an embodiment, the subpixels PXn may emit light of a same color. In other embodiments, the first color of the light emitted by the first subpixel PX1 may be blue, the second color of the light emitted by the second subpixel PX2 may be green, and the third color of the light emitted by the third subpixel PX3 may be red.

Each pixel PX may include an emission area EMA. The emission area EMA may be defined as an area where the light emitting elements 300 included in the display device 10 are disposed to emit light of a particular (or predetermined) wavelength band. The subpixels PXn included in each pixel PX may include sub-emission areas EMAn, respectively. The first subpixel PX1 may include a first sub-emission area EMA1, the second subpixel PX2 may include a second sub-emission area EMA2, and the third subpixel PX3 may include a third sub-emission area EMA3. Although the pixel PX shown in FIG. 2 includes the three sub-emission area EMA1, EMA2 and EMA3, the number of sub-emission areas is not limited thereto. In other embodiments, a pixel PX may include more than three sub-emission areas.

The sub-emission area EMAn of each subpixel PXn may include an area in which the light emitting elements 300 are disposed and light emitted from the light emitting elements 300 is output to an area adjacent to the light emitting elements 300. The sub-emission area EMAn of each subpixel PXn may further include an area from which light emitted from the light emitting elements 300 is output after being reflected or refracted by other members. The light emitting elements 300 may be disposed in each subpixel PXn, and each sub-emission area EMAn may include an area in which the light emitting elements 300 are disposed and an area adjacent to the light emitting elements 300.

Each pixel PX of the display device 10 may further include a non-emission area. The non-emission area of each pixel PX may include a sub-non-emission area of each subpixel PXn. The non-emission area of each pixel PX may be defined as an area other than the emission area EMA. The non-emission area may be an area in which the light emitting elements 300 are not disposed or an area from which no light is output because light emitted from the light emitting elements 300 does not reach the area.

Each pixel PX may include the subpixels PXn and outer banks 430 disposed between the subpixels PXn. Each subpixel PXn of the display device 10 may include electrodes 210 and 220, the light emitting elements 300, contact electrodes 260, inner banks 410 (see FIG. 4), and insulating layers 510, 520, 530 and 550 (see FIG. 4).

The electrodes 210 and 220 may be electrically connected to the light emitting elements 300 and may receive a particular (or predetermined) voltage so that the light emitting elements 300 can emit light of a particular (or predetermined) wavelength band. At least a part of each of the electrodes 210 and 220 may form an electric field in the subpixels PXn to align the light emitting elements 300 disposed in the emission area EMA of the display device 10.

The electrodes 210 and 220 may include a first electrode 210 and a second electrode 220. In an embodiment, the first electrode 210 may be a separate pixel electrode disposed in each subpixel PXn, and the second electrode 220 may be a common electrode connected along the subpixels PXn. One of the first electrode 210 and the second electrode 220 may be anodes of the light emitting elements 300, and the other may be cathodes of the light emitting elements 300. However, embodiments are not limited to this case, and the opposite case may also be true.

Each of the first electrode 210 and the second electrode 220 may include at least one electrode stem 210S or 220S and at least one electrode branch 210B or 220B. The electrode stem 210S or 220S of each electrode 210 or 220 may extend in the first direction DR1, and the electrode branch 210B or 220B of each electrode 210 or 220 may be branched from the electrode stem 210S or 220S and extend in the second direction DR2 intersecting the first direction DR1.

The first electrode 210 may include a first electrode stem 210S and one or more first electrode branches 210B. In an embodiment, the first electrode 210 may include the first electrode stem 210S and two first electrode branches 210B. As described above, the first electrode stem 210S may extend in the first direction DR1, and each of the first electrode branches 210B may be branched from the first electrode stem 210S and extend in a direction (i.e., a downward direction in the drawings) opposite to the second direction DR2 from the first electrode stem 210S. The two first electrode branches 210B may be spaced apart from each other in the first direction DR1.

The first electrode stem 210S may be disposed on an upper side (or the first side in the second direction DR2) of each subpixel PXn in a plan view. Each first electrode stem 210S of a pixel PX may have ends terminated between the subpixels PXn and may be spaced apart from but substantially collinear with the first electrode stems 210S of neighboring subpixels PXn in the same row (e.g., in the first direction DR1). Since the ends of the first electrode stems 210S are spaced apart from each other between the neighboring (or different) subpixels PXn, different electrical signals may be transmitted to the first electrode branches 210B of the different subpixels PXn. Since different electrical signals are transmitted to the first electrode branches 210B of the subpixels PXn, the first electrode branches 210B of adjacent different subpixels PXn may be driven separately.

Each of the first electrode branches 210B may be branched from at least a part of the first branch stem 210S and extend in the direction opposite to the second direction DR2 from the first electrode stem 210S. The first electrode branches 210B may end at a position spaced apart from the second electrode stem 220S. Ends of the first electrode branches 210B in a direction in which the first electrode branches 210B extend may be spaced apart from the second electrode stem 220S.

The second electrode 220 may include a second electrode stem 220S and a second electrode branch 220B. In an embodiment, the second electrode 220 may include one second electrode branch 220B. As described above, the second electrode stem 220S may extend in the first direction DR1, and the second electrode branch 220B may be branched from the second electrode stem 220S and extend in the second direction DR2 (i.e., an upward direction in the drawings) from the second electrode stem 220S.

The second electrode stem 220S may be spaced apart from the first electrode stem 210S in the second direction DR2. The second electrode stem 220S may be disposed on a lower side (or a second side opposite to the first side of the second direction DR2) of each subpixel PXn in a plan view. Ends of the second electrode stem 220S may be electrically connected to the second electrode stems 220S of other subpixels PXn adjacent in the first direction DR1. For example, the second electrode stem 220S may extend in the first direction DR1 to cross each subpixel PXn. The second electrode stem 220S crossing each subpixel PXn may be electrically connected to the periphery of the display area DA in which the pixels PX or the subpixels PXn are disposed or a part extending in one direction from the non-display area NDA.

The second electrode branch 220B may be branched from at least a part of the second electrode stem 220S and extend in the second direction DR2 from the second electrode stem 220S and may end at a position spaced apart from the first electrode stem 210S. An end of the second electrode branch 220B in a direction in which the second electrode branch 220B extends may be spaced apart from the first electrode stem 210S. The second electrode branch 220B may be disposed between the first electrode branches 210B spaced apart from each other in the first direction DR1. The second electrode branch 220B may be spaced apart from and face each of the first electrode branches 210B in the first direction DR1.

The first electrode 210 and the second electrode 220 may be electrically connected to a circuit element layer PAL (see FIG. 4) of the display device 10 through contact holes, for example, a first electrode contact hole CNTD and a second electrode contact hole CNTS, respectively. In the drawings, the first electrode contact hole CNTD may be formed in the first electrode stem 210S of each subpixel PXn, and only one second electrode contact hole CNTS may be formed in one second electrode stem 220S crossing each subpixel PXn. However, embodiments are not limited to this case. The second electrode contact hole CNTS may also be formed in each subpixel PXn.

In the drawings (for example, see FIG. 2), the first electrode 210 of each subpixel PXn includes two first electrode branches 210B, and one second electrode branch 220B is disposed between the two first electrode branches 210B. However, the embodiments are not limited to this case. The first electrode 210 and the second electrode 220 may have various structures without being limited to a particular structure or shape as long as a space in which the light emitting elements 300 are to be disposed can be formed between the first electrode 210 and the second electrode 220. In such structures, the first electrode 210 and the second electrode 220 may be at least partially spaced apart to face each other. In other embodiments, the first electrode 210 and the second electrode 220 may be partially curved or bent, or one of the first electrode 210 and the second electrode 220 may surround the other. In other embodiments, the first electrode 210 and the second electrode 220 may be implemented without the electrode stems.

Each of the outer banks 430 may be disposed at a boundary between the subpixels PXn. The outer banks 430 may extend in the second direction DR2. Each of the outer banks 430 may be disposed at the boundary between the subpixels PXn adjacent to each other in the first direction DR1. The outer banks 430 may extend to other neighboring subpixels PXn in the second direction DR2. Although not illustrated in the drawings, each of the outer banks 430 may also extend in the first direction DR1 and may be disposed at a boundary between the subpixels PXn adjacent to each other in the second direction DR2. The outer banks 430 may be disposed at the boundary of each subpixel PXn to define the boundary of each subpixel PXn.

The first electrode stem 210S disposed between the outer banks 430 may be spaced apart from the outer banks 430. Ends of the first electrode stem 210S of each subpixel PXn disposed between the outer banks 430 may end at positions spaced apart from the outer banks 430. The outer banks 430 and the inner banks 210 (see FIG. 4) may be simultaneously formed in one process and may have a same material.

In case that ink in which the light emitting elements 300 are dispersed is sprayed using an inkjet printing device during the manufacture of the display device 10, the outer banks 430 may prevent the ink from flowing over the boundary of each subpixel PXn. The outer banks 430 may separate inks in which different light emitting elements 300 are dispersed for different subpixels PXn so as to prevent the inks from being mixed with each other.

The light emitting elements 300 may be disposed between the first electrode 20 and the second electrode 220. An end of each of the light emitting elements 300 may be electrically connected to the first electrode 210, and another end, opposite to the end, of each of the light emitting elements 300 may be electrically connected to the second electrode 220. In an embodiment, both ends (i.e., the end and the another end) of each of the light emitting elements 300 may overlap (or at least partially overlap) the respective electrode branches 210B and 220B of the electrodes 210 and 220. However, the embodiments are not limited to this case. For example, at least one of the both ends of each of the light emitting elements 300 may not overlap the respective electrode branches 210B and 220B of the electrodes 210 and 220. The light emitting elements 300 may be electrically connected to the first electrode 210 and the second electrode 220 by the contact electrodes 260 to be described later.

The light emitting elements 300 may be spaced apart from each other and aligned substantially parallel to each other. There may be a gap between the adjacent ones of the light emitting elements 300. Such gap may have a predetermined distance in an embodiment, but may not be limited to a particular distance in other embodiments. As examples, the light emitting elements 300 may be adjacent to each other to form a group, the light emitting elements 300 may be spaced apart at regular intervals, or the light emitting elements 300 may be arranged in a non-uniform density while being oriented or aligned in one direction. In an embodiment, the light emitting elements 300 may extend in one direction, and the direction in which the electrodes 210 and 220, for example, the first and second electrode branches 210B and 220B extend may be substantially perpendicular to the direction in which the light emitting elements 300 extend. For example, the light emitting elements 300 may not be perpendicular but may be oblique to the direction in which the first and second electrode branches 210B and 220B extend.

Figure 5:
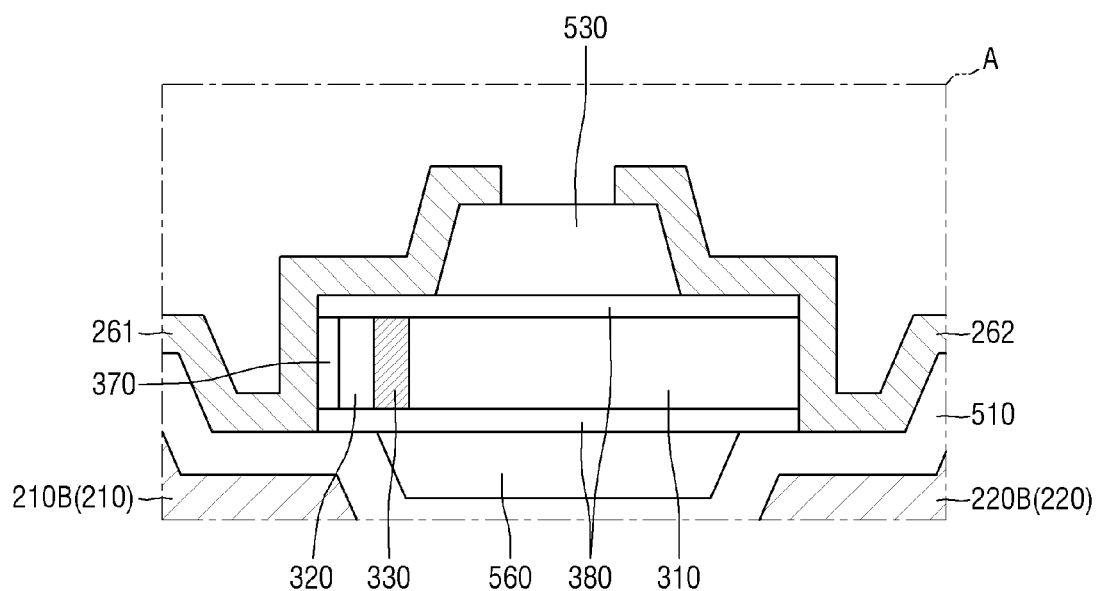
FIG. 5 is a schematic diagram of an enlarged view of portion A of FIG. 4.

Each of the light emitting elements 300 may include an active layer 330 (see FIG. 5). Each of the light emitting elements 300 may emit light of a particular (or predetermined) wavelength band according to a material contained in the active layer 330 (see FIG. 5). In case that the light emitting elements 300 include the active layers 330 (see FIG. 5) including different materials, they may emit light of different wavelength bands.

The display device 10 according to the embodiment may include the light emitting elements 300 which emit light of different wavelength bands. Each light emitting element 300 of the first subpixel PX1 may include an active layer 330 that emits first light L whose central wavelength band is a first wavelength band, each light emitting element 300 of the second subpixel PX2 may include an active layer 330 which emits second light L2 whose central wavelength band is a second wavelength band, and each light emitting element 300 of the third subpixel PX3 may include an active layer 330 which emits third light L3 whose central wavelength band is a third wavelength band. The light emitting elements 300 disposed in the subpixels PX1, PX2 and PX3 may include the active layers 330 which have the same structure but emit light of different colors, respectively.

Accordingly, the first light L1 may be output from the first subpixel PX1, the second light L2 may be output from the second subpixel PX2, and the third light L3 may be output from the third subpixel PX3. In an embodiment, the first light L1 may be blue light whose central wavelength band is in the range of about 450 nm to about 495 nm, the second light L2 may be green light whose central wavelength band is in the range of about 495 nm to about 570 nm, and the third light L3 may be red light whose central wavelength band is in the range of about 620 nm to about 752 nm. However, the embodiments of the lights are not limited thereto. For example, the first light L1, the second light L2, and the third light L3 may have colors different from the above-mentioned colors. In other examples, the first to third lights L1, L2 and L3 may have the same colors as mentioned above, but the central wavelength bands of lights may be different from the ranges mentioned above. In other embodiments, the first subpixel PX1, the second subpixel PX2, and the third subpixel PX3 may include light emitting elements each of which emits light of a substantially same color.

Although not illustrated in FIGS. 2 and 3, the display device 10 may include a first insulating layer 510 (referring to FIG. 4) which at least partially covers (or overlaps) the first electrode 210 and the second electrode 220.

The first insulating layer 510 may be disposed in each subpixel PXn of the display device 10. In an embodiment, the first insulating layer 510 may cover the whole (or substantially whole area) of each subpixel PXn while exposing at least a part of each subpixel PXn. The first insulating layer 510 may extend to other neighboring subpixels PXn. The first insulating layer 510 may at least partially cover (or overlap) the first electrode 210 and the second electrode 220. Although not illustrated in FIGS. 2 and 3, the first insulating layer 510 may expose a part of each of the first electrode 210 and the second electrode 220, specifically, expose a part of each of the first and second electrode branches 210B and 220B.

Referring to FIG. 3, the contact electrodes 260 may include first contact electrodes 261 and a second contact electrode 262. The first contact electrodes 261 may be disposed on the first electrode 210, and the second contact electrode 262 may be disposed on the second electrode 220.

At least a part of each of the contact electrodes 261 and 262 may extend in a same direction. The contact electrodes 260 may be electrically connected with the light emitting elements 300 and the electrodes 210 and 220. The light emitting elements 300 may be electrically connected to the first electrode 210 and the second electrode 220 through the contact electrodes 260 and receive electrical signals from the first electrode 210 and the second electrode 220.

The first contact electrodes 261 may be disposed on the first electrode 210, specifically, on the first electrode branches 210B and extend in the second direction DR2. Each of the first contact electrodes 261 may be electrically connected with an end of each of the light emitting elements 300. In addition, each of the first contact electrode 261 may be electrically connected with at least a part of the first electrode 210 exposed by the first insulating layer 510. Accordingly, the light emitting elements 300 may be electrically connected to the first electrode 210 through the first contact electrodes 261.

The second contact electrode 262 may be disposed on the second electrode 220, specifically, on the second electrode branch 220B and extend in the second direction DR2. The second contact electrode 262 may be spaced apart from the first contact electrodes 261 in the first direction DR1. The second contact electrode 262 may be electrically connected with the other end of each of the light emitting elements 300. In addition, the second contact electrode 262 may be electrically connected with at least a part of the second electrode 220 exposed by the first insulating layer 510. Accordingly, the light emitting elements 300 may be electrically connected to the second electrode 220 through the second contact electrode 262.

In an embodiment, one subpixel PXn may include two first electrode branches 210B and one second electrode branch 220B, and the contact electrodes 260 respectively disposed on the electrode branches 210B and 220B may be spaced apart from each other. Therefore, the contact electrodes 260 disposed in one subpixel PXn may be sequentially disposed at intervals in the order of the first electrode branch 210B, the second electrode branch 220B, and the first electrode branch 210B from the left to the right in a plan view. The number of the first contact electrodes 261 and the number of the second contact electrodes 262 may vary according to the number of the first electrode branches 210B and the number of the second electrode branches 220B included in one subpixel PXn.

In some embodiments, a width of each of the first and second contact electrodes 261 and 262 in the first direction DR1 may be greater than a width of each of the first and second electrodes 210 and 220 in the first direction DR1, specifically, a width of each of the first and second electrode branches 210B and 220B in the first direction DR1.

As an example, each of the first contact electrodes 261 may entirely cover (or overlap) sides of a first electrode branch 210B and extend outward the sides. Likewise, the second contact electrode 262 may entirely cover sides of the second electrode branch 220B and extend outward the sides. Since each of the first and second contact electrodes 261 and 262 entirely covers (or overlaps) a part of one of the first and second electrode branches 210B and 220B and extends outward to contact at least a part of each light emitting element 300, the first and second contact electrodes 261 and 262 may electrically connect the electrodes 210 and 220 to the light emitting elements 300 although each light emitting element 300 may be physically spaced apart from the first and second electrode branches 210B and 220B. However, embodiments are not limited to this case. In other embodiments, each of the first and second contact electrodes 261 and 262 may cover (or overlap) only one side of one of the first and second electrode branches 210B and 220B.

Figure 4:
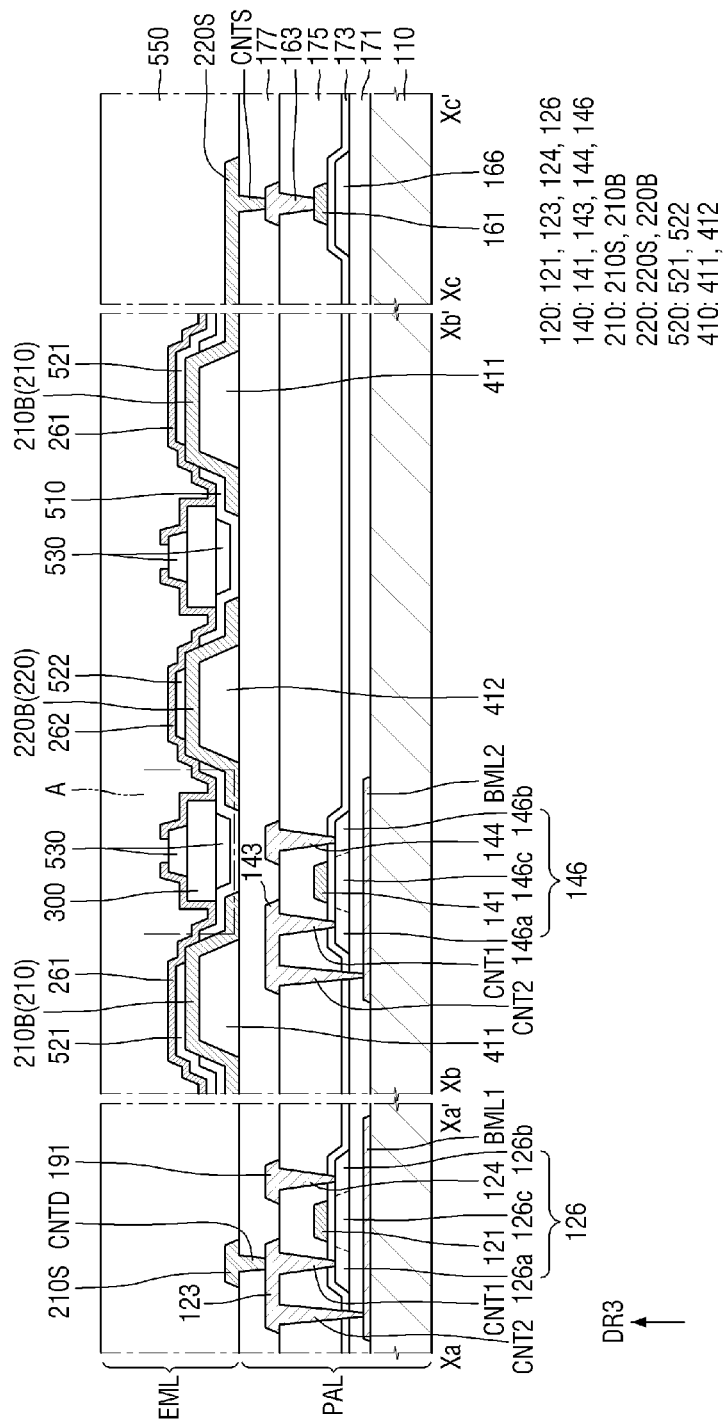
FIG. 4 is a schematic cross-sectional view taken along lines Xa-Xa', Xb-Xb', and Xc-Xc' of FIG. 2.
Figure 6:
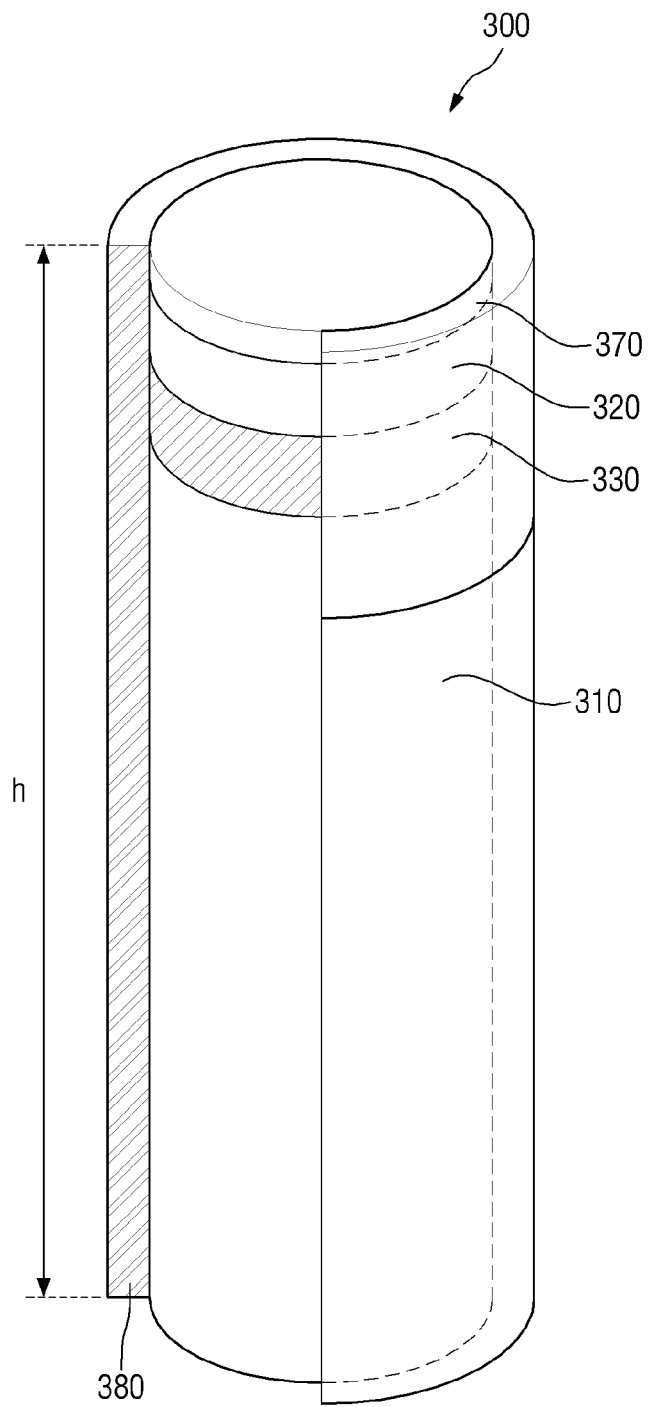
FIG. 6 is a schematic view of a light emitting element according to an embodiment.

FIG. 4 is a schematic cross-sectional view taken along lines Xa-Xa', Xb-Xb', and Xc-Xc' of FIG. 2. FIG. 5 is an enlarged view of portion A of FIG. 4. FIG. 6 is a schematic view of a light emitting element 300 according to an embodiment.

Although a cross section of only the first subpixel PX1 is illustrated in FIG. 4, the same may apply to other pixels PX or subpixels PXn. FIG. 4 illustrates a cross section taken across an end and the other end of a light emitting element 300 disposed in the first subpixel PX1.

Referring to FIG. 4 together with FIGS. 2 and 3, the display device 10 may include the circuit element layer PAL and a light emitting layer EML disposed on the circuit element layer PAL. The circuit element layer PAL may include a substrate 110, a light blocking layer BML, a buffer layer 171, a first transistor 120 and a second transistor 140, and the light emitting layer EML may include the electrodes 210 and 220 disposed above the first and second transistors 120 and 140, the light emitting elements 300, the inner banks 410, and the insulating layers 510, 520, 530 and 560.

The substrate 110 may be an insulating substrate. The substrate 110 may be made of an insulating material such as glass, quartz, or polymer resin. The substrate 110 may be a rigid substrate, but may also be a flexible substrate that can be bent, folded, and rolled.

The light blocking layer BML may be disposed on the substrate 110. The light blocking layer BML may include a first light blocking layer BML1 and a second light blocking layer BML2. The first light blocking layer BML1 may be electrically connected to a first source/drain electrode 123 of the first transistor 120 to be described later, and the second light blocking layer BML2 may be electrically connected to a first source/drain electrode 143 of the second transistor 140. In an embodiment, the respective first source/drain electrodes 123 and 143 of the first and second transistors 120 and 140 may be drain electrodes. However, the opposite case may also be true.

The first light blocking layer BML1 and the second light blocking layer BML2 may overlap a first active material layer 126 of the first transistor 120 and a second active material layer 146 of the second transistor 140 in the thickness direction, respectively. A width of the first light blocking layer BML1 may be greater than a width of the first active material layer 126 of the first transistor 120 disposed on the first light blocking layer BML1. Likewise, a width of the second light blocking layer BML2 may be greater than a width of the second active material layer 146 disposed on the second light blocking layer BML2. The first and second light blocking layers BML1 and BML2 may include a light blocking material and prevent light from entering the first and second active material layers 126 and 146. For example, the first and second light blocking layers BML1 and BML2 may be made of an opaque metal material that blocks transmission of light. In some cases, the light blocking layer BML may be omitted.

The buffer layer 171 may be disposed on the light blocking layer BML and the substrate 110 exposed by the light blocking layer BML. The buffer layer 171 may entirely cover the substrate 110 having the light blocking layer BML. The buffer layer 171 may include contact holes CNT2 penetrating the buffer layer 171 to partially expose the first light blocking layer BML1 and the second light blocking layer BML2.

The buffer layer 171 may prevent diffusion of impurity ions, prevent penetration of moisture or outside air, and perform a surface planarization function. The buffer layer 171 may insulate the light blocking layer BML from the first and second active material layers 126 and 146.

A semiconductor layer may be disposed on the buffer layer 171. The semiconductor layer may include the first active material layer 126 of the first transistor 120, the second active material layer 146 of the second transistor 140, and an auxiliary layer 166. The semiconductor layer may include polycrystalline silicon, monocrystalline silicon, an oxide semiconductor, or the like.

The first active material layer 126 may include a first doping region 126a, a second doping region 126b, and a first channel region 126c. The first channel region 126c may be disposed between the first doping region 126a and the second doping region 126b. The second active material layer 146 may include a third doping region 146a, a fourth doping region 146b, and a second channel region 146c. The second channel region 146c may be disposed between the third doping region 146a and the fourth doping region 146b.

The first active material layer 126 and the second active material layer 146 may include polycrystalline silicon. The polycrystalline silicon may be formed by crystallizing amorphous silicon. Examples of the crystallization method include rapid thermal annealing (RTA), solid phase crystallization (SPC), excimer laser annealing (ELA), metal induced crystallization (MIC), and sequential lateral solidification (SLS). Alternatively, the first active material layer 126 and the second active material layer 146 may include monocrystalline silicon, low-temperature polycrystalline silicon, amorphous silicon, or the like. The first doping region 126a, the second doping region 126b, the third doping region 146a, and the fourth doping region 146b may be regions of the first active material later 126 and the second active material layer 146 doped with impurities.

The first active material layer 126 and the second active material layer 146 are not necessarily limited to the above examples. For example, the first active material layer 126 and the second active material layer 146 may include an oxide semiconductor. The first doping region 126a and the third doping region 146a may be first conducting regions, and the second doping region 126b and the fourth doping region 146b may be second conducting regions. In case that the first active material layer 126 and the second active material layer 146 include an oxide semiconductor, the oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), or indium-gallium-zinc-tin oxide (IGZTO).

A gate insulating layer 173 may be disposed on the semiconductor layer and the buffer layer 171 exposed by the semiconductor layer. The gate insulating layer 173 may entirely cover the buffer layer 171 as well as the semiconductor layer.

The gate insulating layer 173 may include contact holes CNT1 and CNT2. The contact holes CNT1 and CNT2 formed in the gate insulating layer 173 may include first contact holes CNT1 and second contact holes CNT2. The first contact holes CNT1 formed in the gate insulating layer 173 may penetrate the gate insulating layer 173 to partially expose the first active material layer 126 and the second active material layer 146. The second contact holes CNT2 formed in the gate insulating layer 173 may penetrate the gate insulating layer 173 and the buffer layer 171 to partially expose the first light blocking layer BML1 and the second light blocking layer BML2.

The gate insulating layer 173 may include a silicon compound, a metal oxide, or the like. For example, the gate insulating layer 173 may include silicon oxide, silicon nitride, silicon oxynitride, aluminum oxide, tantalum oxide, hafnium oxide, zirconium oxide, titanium oxide, etc. These materials may be used alone or in combination with each other. The gate insulating layer 173 may be a single layer or a multilayer consisting of laminated layers of different materials.

A first conductive layer may be disposed on the gate insulating layer 173. The first conductive layer may include a first gate electrode 121 disposed on the first active material layer 126, a second gate electrode 141 disposed on the second active material layer 146, and a power wiring 161 disposed on the auxiliary layer 166. The first gate electrode 121 may be disposed on the gate insulating layer 173 to overlap the first channel region 126c of the first active material layer 126 in the thickness direction, the second gate electrode 141 may be disposed on the gate insulating layer 173 to overlap the second channel region 146c of the second active material layer 146 in the thickness direction, and the power wiring 161 may be disposed on the auxiliary layer 166 to overlap the auxiliary layer 166 in the thickness direction.

An interlayer insulating film 175 may be disposed on the first conductive layer. The interlayer insulating film 175 may function as an insulating layer between the first conductive layer and other layers disposed on the first conductive layer. The interlayer insulating film 175 may include an organic insulating material and perform a surface planarization function.

A second conductive layer may be disposed on the interlayer insulating film 175. The second conductive layer includes the first source/drain electrode 123 of the first transistor 120, a second source/drain electrode 124 of the first transistor 120, the first source/drain electrode 143 of the second transistor 140, a second source/drain electrode 144 of the second transistor 140, and a power electrode 163.

The first source/drain electrode 123 of the first transistor 120 may be electrically connected with the first doping region 126a of the first active material layer 126 through a contact hole CNT1 penetrating the interlayer insulating film 175 and the gate insulating layer 173, and the first source/drain electrode 123 of the first transistor 120 may be electrically connected with the first light blocking layer BML1 through a contact hole CNT2 penetrating the interlayer insulting film 175, the gate insulating layer 173 and the buffer layer 171.

The second source/drain electrode 124 of the first transistor 120 may be electrically connected with the second doping region 126b of the first active material layer 126 through a contact hole CNT1 penetrating the interlayer insulating film 175 and the gate insulating layer 173.

The first source/drain electrode 123 of the first transistor 120 and the second source/drain electrode 124 of the first transistor 120 may be spaced apart from each other and disposed on the interlayer insulating film 175.

The first source/drain electrode 143 of the second transistor 140 may be electrically connected with the third doping region 146a of the second active material layer 146 through a contact hole CNT1 penetrating the interlayer insulating film 175 and the gate insulating layer 173, and the first source/drain electrode 143 of the second transistor 140 may be electrically connected with the second light blocking layer BML2 through a contact hole CNT2 penetrating the interlayer insulating film 175, the gate insulating layer 173 and the buffer layer 171.

The second source/drain electrode 144 of the second transistor 140 may be electrically connected with the fourth doping region 146b of the second active material layer 146 through a contact hole CNT1 penetrating the interlayer insulating film 175 and the gate insulating layer 173.

The first source/drain electrode 143 of the second transistor 140 and the second source/drain electrode 144 of the second transistor 140 may be spaced apart from each other and disposed on the interlayer insulating film 175.

The first source/drain electrode 123 of the first transistor 120, the first source/drain electrode 143 of the second transistor 140, may be electrically connected with upper surfaces of the first light blocking layer BML1 and the second light blocking layer BML2 through the contact holes CNT2 and thus may be electrically connected to the first light blocking layer BML1 and the second light blocking layer BML2.

The power electrode 163 may be disposed on the power wiring 161. The power electrode 163 may be disposed on the power wiring 161 to overlap the power wiring 161 in the thickness direction. The power electrode 163 may be electrically connected with an upper surface of the power wiring 161 through a contact hole CNT1 penetrating the interlayer insulating film 175 and thus may be electrically connected to the power wiring 161.

A via layer 177 may be disposed on the second conductive layer. The via layer 177 may include the first electrode contact hole CNTD and the second electrode contact hole CNTS penetrating the via layer 177. The via layer 177 may include an organic insulating material and perform a surface planarization function.

The inner banks 410, the outer banks 430, the electrodes 210 and 220, and the light emitting elements 300 may be disposed on the via layer 177.

The inner banks 400 may include first inner banks 411 and a second inner bank 412. The first inner banks 411 and the second inner bank 412 may be disposed adjacent to a center of each subpixel PXn. The first inner banks 411 and the second inner bank 412 may be spaced apart from each other to face each other.

The first electrode 210 may be disposed on the first inner banks 411, and the second electrode 220 may be disposed on the second inner bank 412. Referring to FIGS. 3 and 4, the first electrode branches 21B are disposed on the first inner banks 411, and the second electrode branch 220B is disposed on the second inner bank 412. The number of the first inner banks 411 disposed in one subpixel PXn may be equal to the number of the first electrode branches 210B of the first electrode 210, and the number of the second inner banks 412 may be equal to the number of the second electrode branches 220B of the second electrode 220. In an embodiment, in case that the number of the first electrode branches 210B included in one subpixel PXn is two and the number of the second electrode branches 220B is one, the number of the first inner banks 411 included in the one subpixel PXn may be two, and the number of the second inner banks 412 may be one. Alternatively, the number of the first inner banks 411 and the number of the second inner banks 412 may be greater than the number of the first electrode branches 210B and the number of the second electrode branches 220B, respectively.

The first inner banks 411 and the second inner bank 412 may extend in the second direction DR2 in each subpixel PXn. Although not illustrated in the drawings, the first inner banks 411 and the second inner bank 412 may extend in the second direction DR2 to neighboring subpixels PXn in the second direction DR2. However, embodiments are not limited to this case, and the first inner banks 411 and the second inner bank 412 may also be disposed only within each subpixel PXn to form patterns on the entire surface of the display device 10. The inner banks 410 and the outer banks 430 described above may include, but are not limited to, polyimide (PI).

At least a part of each of the inner banks 410 may protrude from the via layer 177. The inner banks 410 may protrude upward from a plane in which the light emitting elements 300 are disposed. The protruding shape of each of the inner banks 410 is not particularly limited.

Each of the inner banks 410 may include an upper surface, a lower surface, and side surfaces. The upper and lower surfaces of each of the inner banks 410 face each other. Each of the upper and lower surfaces of each inner bank 410 may be disposed in a plane. The plane in which the upper surface is located and the plane in which the lower surface is located may be substantially parallel to each other. Thus, the overall thickness of each of the inner banks 410 may be substantially uniform. The lower surface of each of the inner banks 410 may be disposed on a surface of the via layer 177.

In some embodiments, a width of the upper surface of each inner bank 410 and a width of the lower surface of each inner bank 410 may be different. For example, a plane in which a side surface of each inner bank 410 is located may be inclined to form an acute angle to the surface of the via layer 177. The width of the upper surface of each inner bank 410 may be smaller than that of the lower surface of each inner bank 410.

Since the inner banks 410 protrude from the via layer 177 and have the inclined side surfaces, light travelling to the inclined side surfaces of each inner bank 411 or 412 among light emitted from the light emitting elements 300 may be reflected by the inclined side surfaces of each inner bank 411 or 412. In case that the electrode 210 or 220 disposed on each inner bank 411 or 412 includes a material having high reflectivity, light emitted from the light emitting elements 300 may be reflected by the electrode 210 or 220 located on the inclined side surfaces of each inner bank 411 or 412 to travel toward above the via layer 177.

As described above, the inner banks 410 and the outer banks 430 may be formed of or include a same material in a same process. However, while the outer banks 430 are formed at the boundary of each subpixel PXn to form a lattice pattern, the inner banks 411 and 412 may be disposed in each subpixel PXn to extend in one direction. While the outer banks 430 separate neighboring subpixels PXn and prevent ink from overflowing to adjacent subpixels PXn in an inkjet process, the inner banks 411 and 412 may protrude in each subpixel PXn to reflect light travelling toward the side surfaces of each inner bank 411 or 412 after being emitted from the light emitting elements 300 so that the reflected light can travel toward above the via layer 177. For example, each inner bank 411 or 412 may function as a reflective barrier that reflects light emitted from the light emitting elements 300.

The electrodes 210 and 220 may be disposed on the via layer 177 and the inner banks 410. As described above, the electrodes 210 and 220 may include the electrode stems 210S and 220S and the electrode branches 210B and 220B, respectively. The line Xa-Xa' of FIG. 2 is a line crossing the first electrode stem 210S, the line Xb-Xb' of FIG. 2 is a line crossing the first electrode branches 210B and the second electrode branch 220B of the first sub-emission area EMA1, and the line Xc-Xc' of FIG. 2 is a line crossing the second electrode stem 220S. That is, the first electrode 210 disposed in an area Xa-Xa' of FIG. 4 may be the first electrode stem 210S, the first electrode 210 and the second electrode 220 disposed in an area Xb-Xb' of FIG. 4 may be the first electrode branches 210B and the second electrode branch 220B, respectively, and the second electrode 220 disposed in an area Xc-Xc' of FIG. 4 may be the second electrode stem 220S. The electrode stems 210S and 220S and the electrode branches 210B and 220B may form the first electrode 210 and the second electrode 220, respectively.

Parts of the first electrode 210 and the second electrode 220 may be disposed on the via layer 177, and the other parts of the first electrode 210 and the second electrode 220 may be disposed on the first inner banks 411 and the second inner bank 412. As described above, the first electrode stem 210S of the first electrode 210 and the second electrode stem 220S of the second electrode 220 may extend in the first direction DR1, and the first inner banks 411 and the second inner bank 412 may extend in the second direction DR2 and may also be disposed in neighboring subpixels PXn in the second direction DR2. Although embodiments are not limited to the following case, the first electrode stem 210S and the second electrode stem 220S of the first electrode 210 and the second electrode 220 extending in the first direction DR1 may partially overlap the first inner banks 411 and the second inner bank 412.

The first electrode stem 210S of the first electrode 210 disposed in the area Xa-Xa' of FIG. 4 may penetrate the via layer 177 and contact the first source/drain electrode 123 of the first transistor 120 through the first electrode contact hole CNDT which exposes at least a part of the first source/drain electrode 123 of the first transistor 120. The first electrode 210 may be electrically connected to the first source/drain electrode 123 of the first transistor 120 to receive a predetermined electrical signal.

The second electrode stem 220S of the second electrode 220 disposed in the area Xc-Xc' of FIG. 4 may extend in one direction and may also be disposed in the non-emission area in which the light emitting elements 300 are not disposed. The second electrode stem 220S may penetrate the via layer 177 and contact the power electrode 163 through the second electrode contact hole CNTS which exposes a part of the power electrode 163. The second electrode 220 may be electrically connected to the power electrode 163 and may receive a predetermined electrical signal from the power electrode 163.

Parts of the first electrode 210 and the second electrode 220, for example, the first electrode branches 210B and the second electrode branch 220B may be disposed on the first inner banks 411 and the second inner bank 412, respectively. The first electrode branches 210B of the first electrode 210 may entirely cover upper and side surfaces of the first inner banks 411, and the second electrode branch 220B of the second electrode 220 may entirely cover upper and side surfaces of the second inner bank 412. The first electrode branches 210B of the first electrode 210 and the second electrode branch 220B of the second electrode 220 may cover (or entirely cover) the side surfaces of the first inner banks 411 and the second inner bank 412 and extend outward to cover at least a part of the via layer 177. Since the first inner banks 411 and the second inner bank 412 are spaced apart from each other at the center of each subpixel PXn, the first electrode branches 210B and the second electrode branch 220B may also be spaced apart from each other. The light emitting elements 300 may be disposed in an area between the first electrode 210 and the second electrode 220, for example, in a space between the first electrode branches 210B and the second electrode branch 220B facing each other.

Each of the electrodes 210 and 220 may include a transparent conductive material. For example, each of the electrodes 210 and 220 may include a material such as indium-tin oxide (ITO), indium-zinc oxide (IZO), or indium-tin-zinc oxide (ITZO). In some embodiments, each of the electrodes 210 and 220 may include a conductive material having high reflectivity. For example, each of the electrodes 210 and 220 may include a metal such as silver (Ag), copper (Cu) or aluminum (Al) as a material having high reflectivity. In this case, each of the electrodes 210 and 220 may reflect incident light toward above each subpixel PXn.

Each of the electrodes 210 and 220 may have a structure in which a transparent conductive material and a metal layer having high reflectivity are each stacked in one or more layers or may be formed as a single layer including them. In an exemplary embodiment, each of the electrodes 210 and 220 may have a stacked structure of ITO/Ag/ITO/IZO or may be an alloy containing aluminum (Al), nickel (Ni), lanthanum (La), or the like.

The first insulating layer 510 may be disposed on the via layer 177, the first electrode 210, and the second electrode 220. The first insulating layer 510 partially covers (or overlaps) the first electrode 210 and the second electrode 220. The first insulating layer 510 may cover (or overlap) most of upper surfaces of the first electrode 210 and the second electrode 220 but may partially expose the first electrode 210 and the second electrode 220. The first insulating layer 510 may partially expose the upper surfaces of the first electrode 210 and the second electrode 220, for example, may partially expose upper surfaces of the first electrode branches 210B disposed on the first inner banks 411 and an upper surface of the second electrode branch 220B disposed on the second inner bank 412. That is, the first insulating layer 510 may be disposed on substantially the entire surface of the via layer 177 but may include openings at least partially exposing the first electrode 210 and the second electrode 220. The openings of the first insulating layer 510 may expose the relatively flat upper surfaces of the first electrode 210 and the second electrode 220.

In an embodiment, a step may be formed in the first insulating layer 510 such that a part of an upper surface of the first insulating layer 510 is sunken or recessed between the first electrode 210 and the second electrode 220. In some embodiments, the first insulating layer 510 may include an inorganic insulating material, and a part of the upper surface of the first insulating layer 510 disposed to cover (or overlap) the first electrode 210 and the second electrode 220 may be sunken or recessed due to a step of the members disposed under the first insulating layer 510. The light emitting elements 300 disposed on the first insulating layer 510 between the first electrode 210 and the second electrode 220 may form empty spaces with the sunken or recessed upper surface of the first insulating layer 510. The light emitting elements 300 may be partially spaced apart from the upper surface of the first insulating layer 510, and the material that forms a second insulating layer 520 or a third insulating layer 530 to be described later may fill the spaces.

However, embodiments are not limited to this case, and the first insulting layer 510 may also form a flat upper surface so that the light emitting elements 300 can be disposed. The upper surface may extend in one direction toward the first electrode 210 and the second electrode 220 and end at the inclined side surfaces of the first electrode 210 and the second electrode 220. That is, the first insulating layer 510 may be disposed in areas where the electrodes 210 and 220 overlap the inclined side surfaces of the first inner banks 411 and the second inner bank 412, respectively. The contact electrodes 260 to be described later may at least partially contact the first electrode 210 and the second electrode 220 exposed by the first insulting layer 510 and may smoothly contact the ends of the light emitting elements 300 on the flat upper surface of the first insulating layer 510.

The first insulating layer 510 may insulate the first electrode 210 and the second electrode 220 from each other while protecting the first electrode 210 and the second electrode 220. The first insulating layer 510 may prevent the light emitting elements 300 disposed on the first insulating layer 510 from directly contacting other members and thus being damaged. However, the shape and structure of the first insulating layer 510 are not limited to this example.

The light emitting elements 300 may be disposed on the first insulating layer 510 between the electrodes 210 and 220. For example, one or more light emitting elements 300 may be disposed on the first insulating layer 510 between the electrode branches 210B and 220B. At least some of the light emitting elements 300 disposed in each subpixel PXn may be disposed in an area other than the area between the electrode branches 210B and 220B, for example, may be disposed on the electrode branches 210B and 220B or may be disposed in an area on an outer side of each first electrode branch 210B in the first sub-emission area EMA1. Ends of each of the light emitting elements 300 may be disposed on facing ends of the first and second electrode branches 210B and 220B and may be electrically connected to the electrodes 210 and 220 through the contact electrodes 260.

Referring to FIGS. 5 and 6, a light emitting element 300 may include layers arranged in a direction parallel to the via layer 177. The light emitting element 300 of the display device 10 according to the embodiment may extend in one direction and have a structure in which semiconductor layers are sequentially arranged in the direction. The light emitting element 300 may be shaped like a cylinder having a predetermined length h and a predetermined diameter.

The light emitting element 300 may include a first semiconductor 310, a second semiconductor 320, an active layer 330, an electrode layer 370, and an insulating film 380. In other embodiments, the light emitting element 300 may not include the electrode layer 370 or may include a greater number of the electrode layers 370. The following description of the light emitting element 300 may apply the same even if the number of the electrode layers 370 is changed, or another structure is further included. In the light emitting element 300, the first semiconductor 310, the active layer 330, the second semiconductor 320, and the electrode layer 370 may be sequentially disposed along one direction, and the insulating film 380 may surround outer surfaces of the first semiconductor 310, the active layer 330, the second semiconductor 320, and the electrode layer 370. The direction in which the light emitting element 300 of the display device 10 extends may be parallel to the via layer 177, and semiconductors included in the light emitting element 300 may be sequentially arranged along a direction parallel to an upper surface of the via layer 177. However, embodiments are not limited to this case, and the light emitting element 300 may also have a different structure. For example, the semiconductors of the light emitting element 300 may be arranged in a direction different from that of the embodiment.

The first semiconductor 310 may be an n-type semiconductor. For example, if the light emitting element 300 emits light in a blue wavelength band, the first semiconductor 310 may include a semiconductor material having a chemical formula of $Al_xGa_yIn_{1-x-y}N$ ($0 \le x \le 1$, $0 \le y \le 1$, $0 \le x+y \le 1$). The semiconductor material included in the first semiconductor 310 may be any one or more of n-type doped AlGaInN, GaN, AlGaN, InGaN, AlN, and InN. The first semiconductor 310 may be doped with an n-type dopant, and the n-type dopant may be, for example, Si, Ge, or Sn. In an exemplary embodiment, the first semiconductor 310 may be n-GaN doped with n-type Si.

The second semiconductor 320 may be disposed on the active layer 330. The second semiconductor 320 may be a p-type semiconductor. For example, if the light emitting element 300 emits light in a blue or green wavelength band, the second semiconductor 320 may include a semiconductor material having a chemical formula of $Al_xGa_yIn_{1-x-y}N$ ($0 \le x \le 1$, $0 \le y \le 1$, $0 \le x+y \le 1$). The semiconductor material included in the second semiconductor 320 may be any one or more of p-type doped AlGaInN, GaN, AlGaN, InGaN, AlN, and InN. The second semiconductor 320 may be doped with a p-type dopant, and the p-type dopant may be, for example, Mg, Zn, Ca, Se, or Ba. In an exemplary embodiment, the second semiconductor 320 may be p-GaN doped with p-type Mg.

Although each of the first semiconductor 310 and the second semiconductor 320 consists of one layer in the drawings, embodiments are not limited to this case. In some cases, depending on the material of the active layer 330, each of the first semiconductor 310 and the second semiconductor 320 may include more layers, for example, may further include at least one of a clad layer and a tensile strain barrier reducing (TSBR) layer.

The active layer 330 may be disposed between the first semiconductor 310 and the second semiconductor 320. The active layer 330 may include a material having a single or multiple quantum well structure. When the active layer 330 includes a material having a multiple quantum well structure, it may have a structure in which quantum layers and well layers are alternately stacked. However, embodiments are not limited to this case, and the active layer 330 may also have a structure in which a semiconductor material having a large band gap energy and a semiconductor material having a small band gap energy are alternately stacked or may include different group 3 to 5 semiconductor materials depending on the wavelength band of emitted light.

The active layer 330 may emit light through combination of electron-hole pairs according to an electrical signal received through the first semiconductor 310 and the second semiconductor 320. For example, in case that the active layer 330 emits light in the blue wavelength band, it may include a material such as AlGaN or AlGaInN. In case that the active layer 330 has a multiple quantum well structure in which quantum layers and well layers are alternately stacked, the quantum layers may include a material such as AlGaN or AlGaInN, and the well layers may include a material such as GaN or AlInN. In an embodiment, the active layer 330 may include AlGaInN as a quantum layer and AlInN as a well layer and may emit blue light whose central wavelength band is in the range of about 450 nm to about 495 nm. Light emitted from the active layer 330 is not limited to light in the blue wavelength band. The active layer 330 may emit light in a red or green wavelength band.

The active layer 330 of the light emitting element 300 may emit light of a particular (or predetermined) wavelength band in any direction. Light emitted from the active layer 330 may be radiated through an outer surface of the light emitting element 300 in a longitudinal direction. The light emitted from the active layer 330 may be radiated through both side surfaces. The light emitted from the active layer 330 of the light emitting element 300 may be radiated not only toward both ends of the light emitting element 300 but also in a lateral direction of the light emitting element 300. Therefore, the direction of light emitted from the active layer 330 is not limited to one direction.

The electrode layer 370 may be an ohmic contact electrode. However, the electrode layer 370 is not limited to the ohmic contact electrode and may also be a Schottky contact electrode. The electrode layer 370 may include a conductive metal. For example, the electrode layer 370 may include at least any one of aluminum (Al), titanium (Ti), indium (In), gold (Au), silver (Ag), indium-tin oxide (ITO), indium-zinc oxide (IZO), and indium-tin-zinc oxide (ITZO). Alternatively, the electrode layer 370 may include an n-type or p-type doped semiconductor material. The electrode layer 370 may include the same material or different materials, but embodiments are not limited to this case.

The insulating film 380 may surround the outer surfaces of the semiconductors described above. In an exemplary embodiment, the insulating film 380 may surround the outer surface of at least the active layer 330 and extend in the direction in which the light emitting element 300 extends. The insulating film 380 may protect the above members. For example, the insulating film 380 may surround side surfaces of the above members but may expose both ends of the light emitting element 300 in the longitudinal direction.

In the drawings, the insulating film 380 extends in the direction in which the light emitting element 300 extends (or the longitudinal direction of the light emitting element 300) to cover from the first semiconductor 310 to the electrode layer 370. However, embodiments are not limited to this case, and the insulating film 380 may also cover the active layer 330 and only a part of each of the outer surface of the first semiconductor 310 and the outer surface of the second semiconductor 320 or may cover the outer surface of the electrode layer 370 but may expose at least a part of the outer surface of the electrode layer 370. A thickness of the insulating film 380 may be in the range of, but not limited to, about 10 nm to about 1.0 μm.

The insulating film 380 may include an insulating material such as silicon oxide ($SiO_x$), silicon nitride ($SiN_x$), silicon oxynitride ($SiO_xN_y$), aluminum nitride (AlN), or aluminum oxide ($Al_2O_3$). Accordingly, it is possible to prevent an electrical short circuit that may occur when the active layer 330 directly contacts an electrode that transmits an electrical signal to the light emitting element 300. Since the insulating film 380 protects the outer surface of the light emitting element 300 including the active layer 330, a reduction in luminous efficiency can be prevented.

In some embodiments, the outer surface of the insulating film 380 may be treated. During the manufacture of the display device 10, light emitting elements 300 dispersed in an ink may be sprayed onto electrodes and then aligned. Here, the surface of the insulating film 380 may be hydrophobic or hydrophilic treated so that the light emitting element 300 is kept separate in the ink without being agglomerated with other adjacent light emitting elements 300.

The diameter of the light emitting element 300 may be in the range of about 0.5 µm to about 1.5 µm, and the length h of the light emitting element 300 may be in the range of about 1 µm to about 10 µm. In an exemplary embodiment, the length h of the light emitting element 300 may be in the range of about 2.5 µm to about 4.5 µm.

According to an embodiment, the first semiconductor 310, the active layer 330 and the second semiconductor 320 of the light emitting element 300 may be sequentially disposed along the direction in which the light emitting element 300 extends, and the first semiconductor 310, the active layer 330 and the second semiconductor 320 of the light emitting element 300 may be sequentially disposed on the first insulating layer 510 along the second direction DR2.

The insulating film 380 of the light emitting element 300 may partially contact the first insulating layer 510. The insulating film 380 may be formed on the outer surface of the light emitting element 300 excluding an end of the light emitting element 300 which may be electrically connected with a first contact electrode 261 and the other end of the light emitting element 300 which may be electrically connected with the second contact electrode 262. The outer surfaces of the first semiconductor 310, the second semiconductor 320, the active layer 330 and the electrode layer 370 of the light emitting element 300 may be surrounded by the insulating film 380. In the light emitting element 300, the active layer 330 which emits light may be surrounded and protected by the insulating film 380 and the first insulating layer 510.

Ends of the light emitting element 300 may be electrically connected with the contact electrodes 260. An end of the light emitting element 300 may be electrically connected with the first contact electrode 261 disposed on a first electrode branch 210B of the first electrode 210, and the other end of the light emitting element 300 may be electrically connected with the second contact electrode 262 disposed on the second electrode branch 220B of the second electrode 220. According to an embodiment, since end surfaces of the light emitting element 300 in the direction in which the light emitting element 300 extends are exposed without being covered with the insulating film 380, the exposed end surfaces may be electrically connected with the first contact electrode 261 and the second contact electrode 262 to be described later. For example, at least a part of the insulating film 380 of the light emitting element 300 may be removed to partially expose side surfaces of both ends of the light emitting element 300. The insulating film 380 of the light emitting element 300 may be partially removed in case that the third insulating layer 530 is formed to cover (or overlap) the outer surface of the light emitting element 300 during a manufacturing process of the display device 10. The exposed side surfaces of the light emitting element 300 may be electrically connected with the first contact electrode 261 and the second contact electrode 262.

Referring again to FIG. 4, the second insulating layer 520 is disposed on the first electrode 210 and the second electrode 220. The second insulating layer 520 may include a $(2A)^{th}$ insulating layer 521 and a $(2B)^{th}$ insulating layer 522.

The $(2A)^{th}$ insulating layer 521 may be disposed on the first electrode branches 210B of the first electrode 210, and the $(2B)^{th}$ insulating layer 522 may be disposed on the second electrode branch 220B of the second electrode 220.

The $(2A)^{th}$ insulating layer 521 may be disposed on the first electrode branches 210B of the first electrode 210 to overlap the upper surfaces of the first inner banks 411. That is, the $(2A)^{th}$ insulating layer 521 may be entirely disposed on a part of each first electrode branch 210B which overlaps the upper surface of a first inner bank 411 and may extend outward to be disposed on a part of each first electrode branch 210B which overlaps a side surface of the first inner bank 411. The $(2A)^{th}$ insulating layer 521 and the first insulating layer 510 disposed on each first electrode branch 210B of the first electrode 210 may be spaced apart from each other on the first electrode branch 210B. Therefore, the $(2A)^{th}$ insulating layer 521 may not be disposed on the other side surface of the first inner bank 411 which overlaps the first insulating layer 510.

The $(2B)^{th}$ insulating layer 522 may be disposed on the second electrode branch 220B of the second electrode 220 to overlap the upper surface of the second inner bank 412. The $(2B)^{th}$ insulating layer 522 may be entirely disposed on a part of the second electrode branch 220B which overlaps the upper surface of the second inner bank 412. The $(2B)^{th}$ insulating layer 522 disposed on the second inner bank 412 may not overlap the side surfaces of the second inner bank 412. Therefore, the $(2B)^{th}$ insulating layer 522 may not extend outward from the upper surface of the second inner bank 412, unlike the $(2A)^{th}$ insulating layer 521 disposed on the first inner banks 411. The $(2B)^{th}$ insulating layer 522 and the first insulating layer 510 disposed on the second electrode branch 220B of the second electrode 220 may be spaced apart from each other on the second electrode branch 220B. The second insulating layer 520 will be described in detail later with reference to FIGS. 7 through 9.

The third insulating layer 530 may be disposed on the light emitting elements 300 disposed between the first electrode branches 210B of the first electrode 210 and the second electrode branch 220B of the second electrode 220. The third insulating layer 530 may be disposed on the light emitting elements 300 to expose at least a part of each of the light emitting elements 300. The third insulating layer 530 may partially surround the outer surface of each of the light emitting elements 300. The third insulating layer 530 may fix the light emitting elements 300 during the manufacturing process of the display device 10 while protecting the light emitting elements 300. In an embodiment, a portion of the material of the third insulating layer 530 may be disposed in a space between a lower surface of each light emitting element 300 and the first insulating layer 510. The third insulating layer 530 may be formed to fill the space between the first insulating layer 510 and each light emitting element 300 in the manufacturing process of the display device 10. Accordingly, the third insulating layer 530 may surround the outer surface of each of the light emitting elements 300.

The third insulating layer 530 may be disposed between the first electrode branches 210B and the second electrode branch 220B in a plan view. The third insulating layer 530 disposed between the first electrode branches 210B and the second electrode branch 220B may extend in the second direction DR2. For example, the third insulating layer 530 may have an island shape or a linear shape on the via layer 177 in a plan view. According to an embodiment, the third insulating layer 530 may be disposed on the light emitting elements 300 in the first sub-emission area EMA1.

The contact electrodes 260 may be disposed on the second insulating layer 520 and the third insulating layer 530. The contact electrodes 260 may also be disposed on the light emitting elements 300 exposed by the third insulating layer 530 and the first insulating layer 510 exposed by the light emitting elements 300.

The contact electrodes 260 may include the first contact electrodes 261 and the second contact electrode 262. The first contact electrodes 261 may be entirely disposed on the second insulating layer 521 disposed on the first electrode branches 210B of the first electrode 210 and may extend outward to be disposed on the third insulating layer 530 disposed on the light emitting elements 300. The second contact electrode 262 may be entirely disposed on the second insulating layer 520 disposed on the second electrode branch 220B of the second electrode 220 and may extend outward to be disposed on the third insulating layer 530 disposed on the light emitting elements 300. The first contact electrodes 261 and the second contact electrode 262 may be spaced apart from each other on the third insulating layer 530. Accordingly, the first contact electrodes 261 and the second contact electrode 262 may be insulated from each other.

As described above, the first contact electrodes 261 and the second contact electrode 262 may extend in the second direction DR2 in a plan view and may be spaced apart from each other in the first direction DR1. The first and second contact electrode 261 may be electrically connected with the light emitting elements 300 and the first and second electrodes 210 and 220. For example, at least a part of each of the first and second contact electrodes 261 and 262 may be electrically connected with at least an end of each light emitting element 300, and at least another part of each of the first and second contact electrodes 261 and 262 may be electrically connected with a first electrode branch 210B of the first electrode 210 and/or the second electrode branch 220B of the second electrode 220.

Specifically, each of the first contact electrodes 261 may be disposed on the second insulating layer 520 disposed on a first inner bank 411 and contact at least a part of a first electrode branch 210B of the first electrode 210 through contact holes 520H (see FIG. 7) formed in the second insulating layer 520. Each of the first contact electrodes 261 may be electrically connected to the first electrode 210 through the contact holes 520H formed in the second insulating layer 520 to receive an electrical signal. Therefore, at least a part of each of the first contact electrodes 261 may be in contact and/or be electrically connected with the first electrode 210, and another part of each of the first contact electrodes 261 may be in contact and/or be electrically connected with an end of each light emitting element 300. Accordingly, an electrical signal transmitted from the first electrode 210 may be delivered to the light emitting elements 300 through each of the first contact electrodes 261.

The second contact electrode 262 may be disposed on the second insulating layer 520 disposed on the second inner bank 412 and electrically connected with at least a part of the second electrode branch 220B of the second electrode 220 through a plurality of contact holes 520H (see FIG. 7) formed in the second insulating layer 520. The second contact electrode 262 may be electrically connected to the second electrode 220 through the contact holes 520H (see FIG. 7) formed in the second insulating layer 520 to receive an electrical signal. Therefore, at least a part of the second contact electrode 262 may be in contact and/or be electrically connected with the second electrode 220, and another part of the second contact electrode 262 may be in contact and be electrically connected with the other end of each light emitting element 300 which is opposite to the end of each light emitting element 300 in contact and/or electrically connected with each of the first contact electrodes 261. Accordingly, an electrical signal transmitted from the second electrode 220 may be delivered to the light emitting elements 300 through the second contact electrode 262.

The contact electrodes 260 may include a conductive material such as, but not limited to, ITO, IZO, ITZO, or Al.

A passivation layer 550 may be disposed on the contact electrodes 260 and the third insulating layer 530. The passivation layer 550 may be disposed (or entirely disposed) on members disposed on the via layer 177 and function to protect the members disposed on the via layer 177 from the external environment.

Each of the first insulating layer 510, the second insulating layer 520, the third insulating layer 530, and the passivation layer 550 may include an inorganic insulating material or an organic insulating material. In an embodiment, the first insulating layer 510, the second insulating layer 520, the third insulating layer 530, and the passivation layer 550 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). The first insulating layer 510, the second insulating layer 520, and the passivation layer 550 may include an organic insulating material such as acrylic resin, epoxy resin, phenolic resin, polyamide resin; polyimide resin, unsaturated polyester resin; polyphenylene resin; polyphenylene sulfide resin, benzocyclobutene (BCB), cardo resin, siloxane resin, silsesquioxane resin; polymethyl methacrylate, polycarbonate, or polymethyl methacrylate-polycarbonate synthetic resin.

Figure 7:
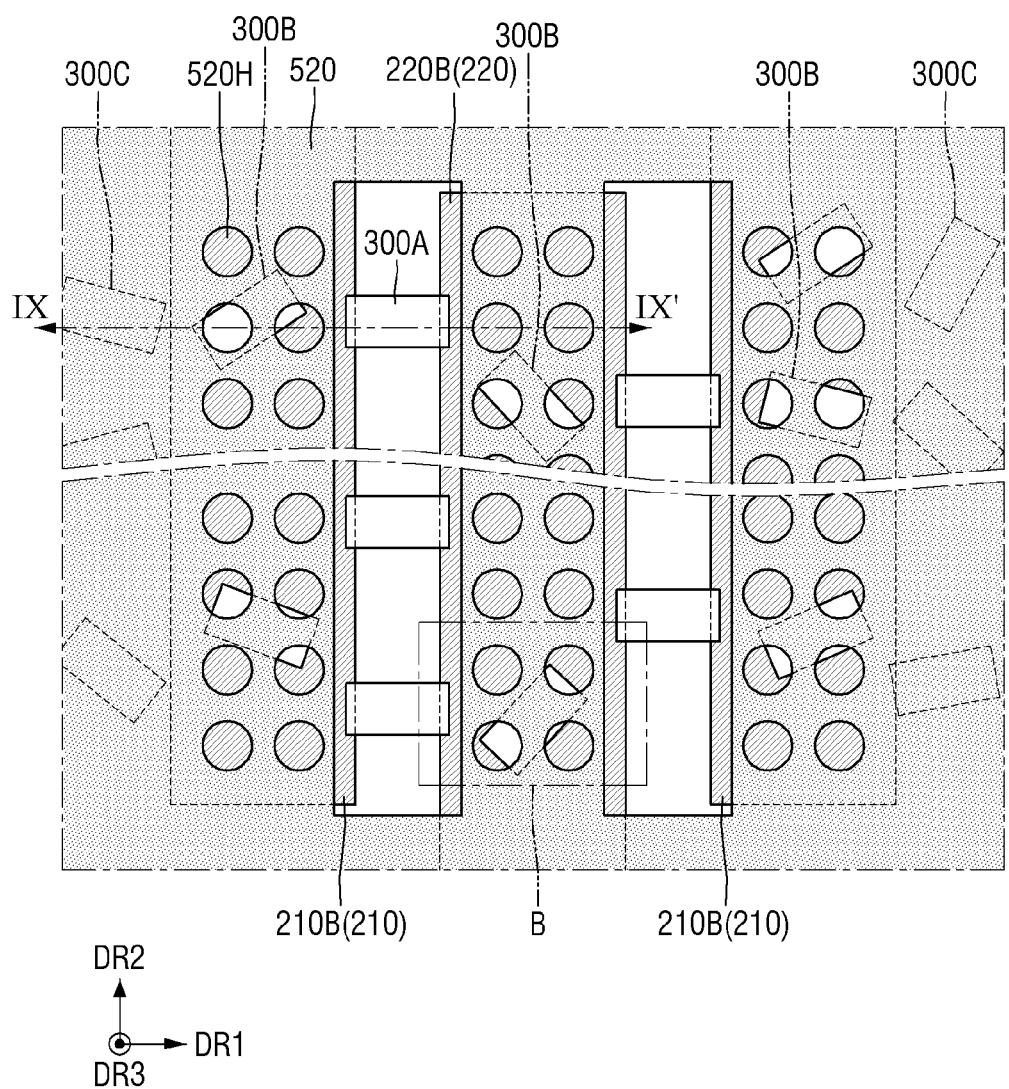
FIG. 7 is a schematic layout view illustrating relative positions of electrodes, light emitting elements, and a second insulating layer in a sub-emission area of one subpixel according to an embodiment.
Figure 8:
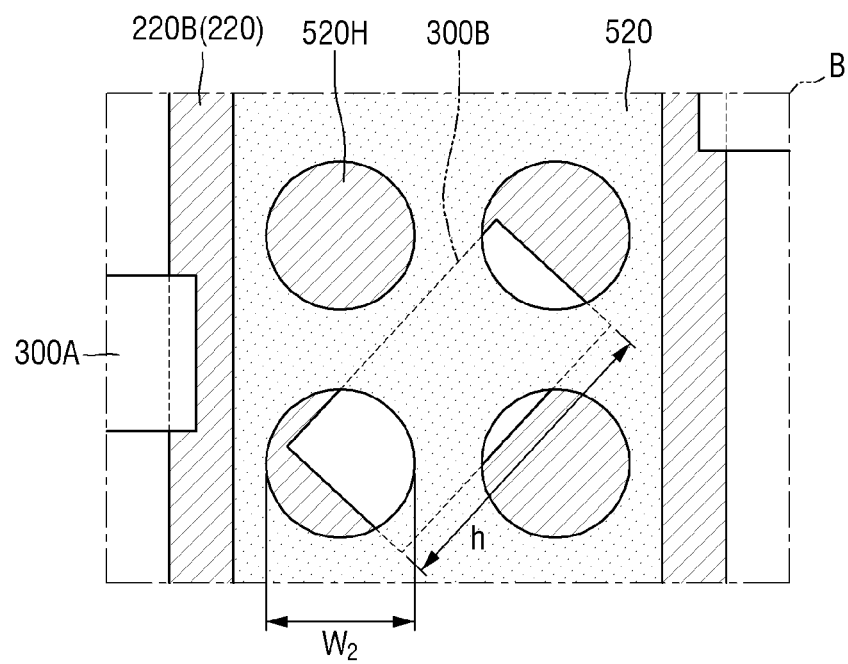
FIG. 8 is a schematic diagram of an enlarged view of portion B of FIG. 7.
Figure 9:
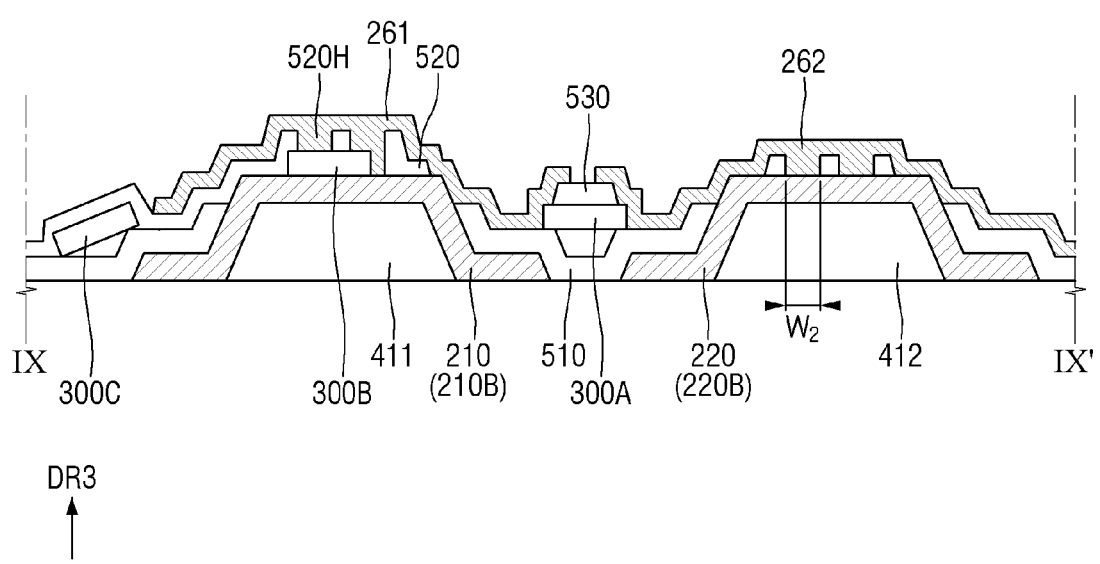
FIG. 9 is a schematic cross-sectional view taken along line IX-IX' of FIG. 7 in an embodiment.

FIG. 7 is a layout view illustrating relative positions of the electrodes 210 and 220, the light emitting elements 300, and the second insulating layer 520 in a sub-emission area EMA of one subpixel according to an embodiment. FIG. 8 is an enlarged view of portion B of FIG. 7. FIG. 9 is a schematic cross-sectional view taken along line IX-IX' of FIG. 7 in an embodiment.

Referring to FIGS. 7 through 9, light emitting elements 300 disposed in the first sub-emission area EMA1 may include first light emitting elements 300A, second light emitting elements 300B, and third light emitting elements 300C. The first light emitting elements 300A, the second light emitting elements 300B, and the third light emitting elements 300C may be substantially the same as the light emitting elements 300 described above. Therefore, a description of the structure and shape of each of the light emitting elements 300A, 300B and 300C will be replaced with the above description of the light emitting elements 300.

The structure of the second insulating layer 520 according to an area where the light emitting elements 300 are disposed will now be described in detail.

At least some of the light emitting elements 300 of the display device 10 may be disposed in a space between each first electrode branch 210B and the second electrode branch 220B, and some other ones of the light emitting elements 300 may be disposed on a part of each of the first electrode branches 210B overlapping the upper surfaces of the first inner banks 411 and/or a part of the second electrode branch 220B overlapping the upper surface of the second inner bank 412, and the other ones of the light emitting elements 300 may be disposed on the outer side of each first electrode branch 210B in the first sub-emission area EMA1. The outer side of each first electrode branch 210B may be defined as a side opposite to a side facing the second electrode branch 220B among both sides of each first electrode branch 210B in the first direction DR1.

Of the light emitting elements 300, the first light emitting elements 300A may be defined as light emitting elements disposed in the space between each first electrode branch 210B and the second electrode branch 220B, the second light emitting elements 300B may be defined as light emitting elements disposed on a part of each of the first electrode branches 210B overlapping the upper surfaces of the first inner banks 411 and/or a part of the second electrode branch 220B overlapping the upper surface of the second inner bank 412, and the third light emitting elements 300C may be defined as light emitting elements disposed on the outer side of each first electrode branch 210B in the first sub-emission area EMA1.

The first light emitting elements 300A may be substantially the same as the light emitting elements 300 described above with reference to FIGS. 2 through 5. Therefore, the first light emitting elements 300A may be disposed between the first electrode branch 210B and the second electrode branch 220B. A direction in which the first light emitting elements 300A extend may be substantially parallel to a direction in which the first electrode branches 210B are spaced apart from the second electrode branch 220B, that is, the first direction DR1. Therefore, one of the ends of each first light emitting element 300A may overlap a first electrode branch 210B, and the other of the ends of each first light emitting elements 300A may overlap the second electrode branch 220B. However, embodiments are not limited to this case, and the ends of each first light emitting element 300A may also not overlap the first electrode branch 210B and/or the second electrode branch 220B. Even in this case, the first light emitting elements 300A may be electrically connected to the first electrode branches 210B and/or the second electrode branch 220B by the contact electrodes 260 as described above.

The second light emitting elements 300B may be disposed on the first electrode branches 210B and/or the second electrode branch 220B. The second light emitting elements 300B may be disposed on the upper surfaces of the first electrode branches 210B and/or the upper surface of the second electrode branch 220B disposed on the upper surfaces of the first inner banks 411 and/or the upper surface of the second inner bank 412. The second light emitting elements 300B may be randomly disposed on the upper surfaces of the first electrode branches 210B and/or the upper surface of the second electrode branch 220B in any direction. Unlike the first light emitting elements 300A extending in the direction substantially parallel to the first direction DR1, the second light emitting elements 300B may extend in the direction parallel to the first direction DR1 or in a direction at a predetermined angle to the first direction DR1.

The third light emitting elements 300C may be disposed on the outer side of each first electrode branch 210B, that is, on a side opposite to a side of each first electrode branch 210B facing the second electrode branch 220B. The third light emitting elements 300C may be disposed on the first insulating layer 510 disposed on the side opposite to the side of each first electrode branch 210B facing the second electrode branch 220B. The third light emitting elements 300C may be randomly disposed on the upper surface of the first insulating layer 510 in any direction. The third light emitting elements 300C may extend in the direction parallel to the first direction DR1 or in a direction at a predetermined angle to the first direction DR1.

During the manufacturing process of the display device 10, the light emitting elements 300 may be sprayed onto the first electrode 210 and the second electrode 220, and an electrical signal may be transmitted to each electrode 210 or 220 to align the light emitting elements 300. In case that the electrical signal is transmitted, an electric field may be formed between the electrodes 210 and 220, and the position and orientation direction of the light emitting elements 300 may be changed by the electric field. Accordingly, the light emitting elements 300 may be disposed between the electrodes 210 and 220. Some of the light emitting elements 300, like the first light emitting elements 300A, may be disposed between the electrodes 210 and 220 by the electric field. In contrast, some other light emitting elements 300, for example, the second light emitting elements 300B and the third light emitting elements 300C, may be disposed on the electrodes 210 and 220 or in an area other than the spaces in which the electrodes 210 and 220 face each other.

The first light emitting elements 300A may be disposed and fixed in position on the third insulating layer 530, and ends of each of the first light emitting elements 300A may be electrically connected to the electrodes 210 and 220 by the contact electrodes 261 and 262, respectively. In contrast, the second light emitting elements 300B and the third light emitting elements 300C may remain not electrically connected to the electrodes 210 and 220. Thus, the second light emitting elements 300B and the third light emitting elements 300C can be lost during a subsequent process and remain as foreign objects within the display device 10. However, the display device 10 according to the embodiment includes the second insulating layer 520 disposed on the second light emitting elements 300B and the third light emitting elements 300C in addition to the third insulating layer 530 disposed on the first light emitting elements 300A to prevent the second light emitting elements 300B and the third light emitting elements 300C from being lost during the manufacturing process of the display device 10.

The second insulating layer 520 may be disposed on the surface (or entire surface) of the via layer 177 in a plan view but may expose the first insulating layer 510 disposed in the space between each first electrode branch 210B and the second electrode branch 220B. The contact holes 520H penetrating the second insulating layer 520 may be formed in a part of the second insulting layer 520 disposed on the first electrode branches 210B and the second electrode branch 220B. The contact holes 520H may not be formed in the other part of the second insulating layer 520 disposed on the outer side of each first electrode branch 210B. The contact electrodes 260 disposed on the second insulating layer 520 may physically contact the upper surfaces of the electrode branches 210B and 220B through the contact holes 520H penetrating the second insulating layer 520 as will be described later.

The second insulating layer 520 disposed on the first electrode branches 210B and/or the second electrode branch 220B may cover (or overlap) the second light emitting elements 300B and the upper surfaces of the first electrode branches 210B or the upper surface of the second electrode branch 220B exposed by the second light emitting elements 300B. Therefore, a part of a lower surface of the second insulating layer 520 disposed on the first electrode branches 210B and/or the second electrode branch 220B may be electrically connected with the insulating films 380 of the second light emitting elements 300B, and the other part of the lower surface of the second insulating layer 520 may be electrically connected with the upper surfaces of the first electrode branches 210B or the upper surface of the second electrode branch 220B.

The contact holes 520H may be formed in the second insulating layer 520 disposed on the first electrode branches 210B and/or the second electrode branch 220B. The contact holes 520H may completely penetrate the second insulating layer 520 in the third direction DR3 (or the thickness direction).

The contact holes 520H may be shaped like circles having the same area in a plan view. The planar shape of each of the contact holes 520H formed in the second insulating layer 520 may be a circle having a predetermined diameter $W_2$. However, the planar shape of each of the contact holes 520H is not limited to the above example and may also be another shape such as a square, an oval or a rectangle, or the planar shapes of the contact holes 520H may have different sizes.

The contact holes 520H may be spaced apart from each other by a gap. The contact holes 520H may be spaced apart from each other along the first direction DR1 and the second direction DR2 by a gap. In an exemplary embodiment, a gap between two contact holes 520H adjacent to each other in the first direction DR1 may be equal to a gap between two contact holes 520H adjacent to each other in the second direction DR2. In other embodiments, the gap between two contact holes 520H adjacent to each other in the first direction DR1 may also be different from the gap between two contact holes 520H adjacent to each other in the second direction DR2 depending on the shape of each individual contact hole 520H. Although two contact holes 520H of the second insulating layer 520 are disposed in the first direction DR1 in the drawings, the arrangement and number of the contact holes 520H formed in the second insulating layer 520 are not limited to this example and can vary.

The contact holes 520H formed in the second insulating layer 520 may at least partially expose the first electrode branches 210B and the second electrode branch 220B (or the first electrode 210 and the second electrode 220) disposed under the second insulating layer 520. The contact holes 520H formed in the second insulating layer 520 may at least partially expose the second light emitting elements 300B disposed under the second insulating layer 520 and overlapping the contact holes 520H in the third direction DR3.

Relative sizes of each contact hole 520H and a length h of each second light emitting element 300B disposed on the second electrode branch 220B will now be described in detail with reference to FIG. 8. The relationship between the second electrode branch 220B and the second light emitting elements 300B described in detail below can be applied the same to the relationship between each first electrode branch 210B and the second light emitting elements 300B.

Referring to FIG. 8, the diameter $W_2$ of each contact hole 520H may be smaller than the length h of a light emitting element 300 (or 300B). In an embodiment, the length h of the light emitting element 300 may be in the range of about 2.5 μm to about 4.5 μm, and the diameter $W_2$ of each contact hole 520H may be smaller than the length h of the light emitting element 300. For example, when the length h of the light emitting element 300 is about 3.5 μm, the diameter $W_2$ of each contact hole 520H may be smaller than about 3.5 μm. Even in this case, the diameter $W_2$ of each contact hole 520H may be formed as large as possible within a range smaller than about 3.5 μm in order to increase a contact area between each contact electrode 261 or 262 and each electrode 210 or 220 (or each electrode branch 210B or 220B). Therefore, the second light emitting element 300B disposed randomly on the second electrode branch 220B in any direction may not be completely exposed by each contact hole 520H of the second insulating layer 520 in the third direction DR3.

Thus, even in case that each contact hole 520H and the second light emitting element 300B overlap in the thickness direction DR3, the second insulating layer 520 may be disposed on at least a part of the second light emitting element 300B. Accordingly, the second light emitting element 300B may be fixed on the second electrode branch 220B by the second insulating layer 520 disposed on at least a part of the second light emitting element 300B. Since the diameter $W_2$ of each contact hole 520H is smaller than the length h of the second light emitting element 300B, the second light emitting element 300B can be prevented from moving from the second electrode branch 220B onto another member through the contact hole 520H. Therefore, the second insulating layer 520 in which the contact holes 520H are formed may fix the second light emitting element 300B onto a first electrode branch 210B and/or the second electrode branch 220B and prevent the second light emitting element 300B from moving onto a member other than the first electrode branch 210B and the second electrode branch 220B.

Referring again to FIGS. 7 and 9, the second insulating layer 520 disposed on the first electrode branches 210B may be disposed on the upper surfaces of the first electrode branches 210B and may extend outward from the first electrode branches 210B and may also be disposed on the first insulating layer 510.

The third light emitting elements 300C may be disposed on at least a part of the first insulating layer 510 disposed on the outer side of each first electrode branch 210B. The second insulating layer 520 may cover (or overlap) the first insulating layer 510 exposed by the third light emitting elements 300C and the third light emitting elements 300C. As described above, the contact holes 520H may not be formed in the second insulating layer 520 disposed on the outer side of each first electrode branch 210B. Therefore, the second insulating layer 520 may completely cover (or overlap) the third light emitting elements 300C and the first insulating layer 510 exposed by the third light emitting elements 300C.

Referring to FIG. 9, as described above, the contact electrodes 260 may be disposed on the second insulating layer 520. The contact electrodes 260 may physically contact the upper surfaces of the electrodes 210 and 220 disposed under the contact electrodes 260, respectively, through the contact holes 520H formed in the second insulating layer 520.

For example, a first contact electrode 261 may be disposed on the second insulating layer 520 disposed on the first electrode 210 (or a first electrode branch 210B). The first contact electrode 261 may physically contact the first electrode 210 (or the first electrode branch 210B) through contact holes 520H of the second insulating layer 520. The first contact electrode 261 and the first electrode branch 210B may be in contact and/or be electrically connected with each other through the contact holes 520H. Therefore, the first contact electrode 261 electrically connected to the first electrode 210 through the contact holes 520H may transmit an electrical signal from the first electrode 210 to a first light emitting element 300A.

Likewise, the second contact electrode 262 may be disposed on the second insulating layer 520 disposed on the second electrode 220 (or the second electrode branch 220B). The second contact electrode 262 may physically contact the second electrode 220 (or the second electrode branch 220B)

through contact holes 520H of the second insulating layer 520. The second contact electrode 262 and the second electrode branch 220B may be in contact and/or be electrically connected with each other through the contact holes 520H. Therefore, the second contact electrode 262 electrically connected to the second electrode 220 through the contact holes 520H may transmit an electrical signal from the second electrode 220 to the first light emitting element 300A.

A second light emitting element 300B disposed on the first electrode 210 and the first electrode 210 may include a side facing the second electrode 220 and another side opposite to the side. The second light emitting element 300B and the third light emitting element 300C disposed at the another side of the first electrode 210, may not be disposed between the electrodes 210 and 220. Therefore, the second light emitting element 300B and the third light emitting element 300C, unlike the first light emitting element 300A, may not be electrically connected to the first electrode 210 or the second electrode 220. The second insulating layer 520 may cover (or overlap) the second light emitting element 300B and the third light emitting element 300C to prevent the second light emitting element 300B and the third light emitting element 300C from being lost during the manufacturing process of the display device 10.

Since the second insulating layer 520 includes the contact holes 520H, the contact electrodes 261 and 262 may respectively contact the electrodes 210 and 220, and the first light emitting element 300A whose both ends contact the contact electrodes 261 and 262 may emit light of a particular (or predetermined) wavelength band in response to an electrical signal. The display device 10 according to the embodiment includes a plurality of light emitting elements 300 disposed at different positions and includes the second insulating layer 520 disposed to cover (or overlap) some of the light emitting elements 300. Therefore, it is possible to prevent some of the light emitting elements 300 from remaining as foreign matter in the display device 10.

Embodiments of the first insulating layer 510 and/or the second insulating layer 520 will now be described. In the following embodiments, a description of elements identical to those of the above-described embodiment will be omitted or given briefly, and differences will be mainly described.

Figure 10:
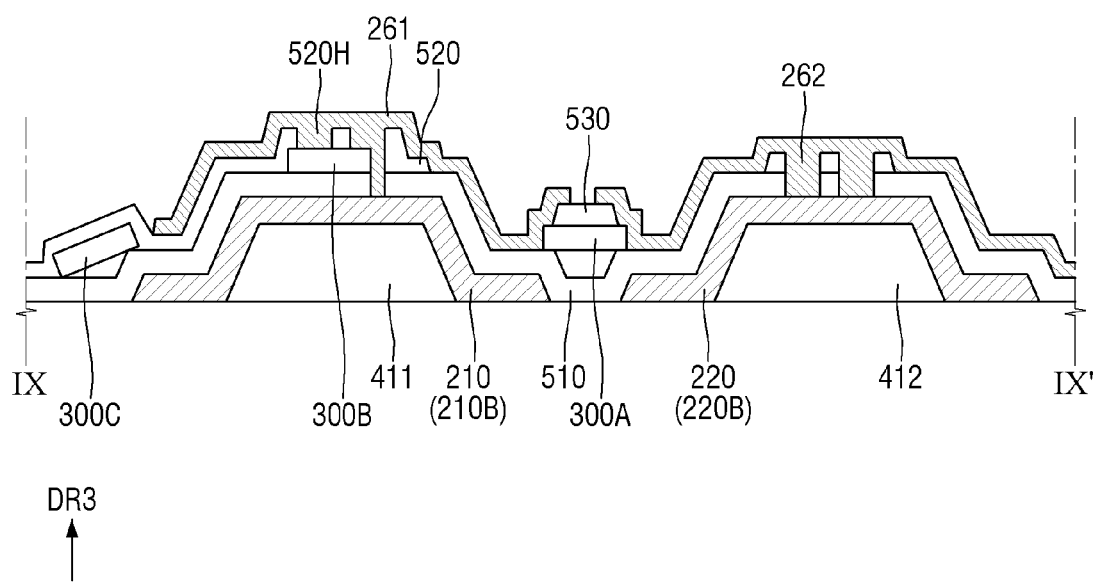
FIG. 10 is a schematic cross-sectional view taken along line IX-IX' of FIG. 7 in another embodiment.

FIG. 10 is a schematic cross-sectional view taken along line IX-IX' of FIG. 7 in another embodiment.

The embodiment of FIG. 10 is different from the embodiment of FIG. 9 in that a first insulating layer 510 is also disposed on each electrode 210 or 220. In FIGS. 10 through 13, a first electrode 210 may be understood as a first electrode branch 210B of the first electrode 210, and a second electrode 220 may be understood as a second electrode branch 220B of the second electrode 220.

The first insulating layer 510 may be entirely disposed on each electrode 210 or 220 and a via layer 177 exposed by each electrode 210 or 220. A second light emitting element 300B and a second insulating layer 520 may be disposed on an upper surface of the first electrode 210 and/or the second electrode 220.

Contact holes exposing at least a part of an upper surface of the first electrode 210 and/or the second electrode 220 may be formed in the first insulating layer 510 disposed under the second insulating layer 520. The contact holes formed in the first insulating layer 510 may be formed at the same positions as the contact holes 520H formed in the second insulating layer 520. However, if the second light emitting element 300B is interposed between the contact holes 520H formed in the first insulating layer 510 and the second insulating layer 520, the contact holes may not be formed in the first insulating layer 510.

In case that the first insulating layer 510 is entirely placed on the via layer 177, inner banks 410 and each electrode 210 or 220, an ink in which the light emitting elements 300 are dispersed may be sprayed using an inkjet printing device, and then the contact holes 520H may be formed after the second insulating layer 520 is placed, a display device 10 structured as in FIG. 10 may be formed.

Since the first insulating layer 510 is interposed between the second light emitting element 300B disposed on each electrode 210 or 220 and each electrode 210 or 220, each electrode 210 or 220 and the second light emitting element 300B may be electrically insulated from each other. Therefore, it is possible to prevent an electrical signal from being transmitted from the first electrode 210 or the second electrode 220 to the second light emitting element 300B. Even in case that contact electrodes 261 and 262 are respectively insulated from the electrodes 210 and 220 by the first insulating layer 510 entirely disposed on the via layer 177 and the electrodes 210 and 220, the contact electrodes 261 and 262 may physically contact and be electrically connected to the electrodes 210 and 220, respectively, through the contact holes 520H.

Figure 11:
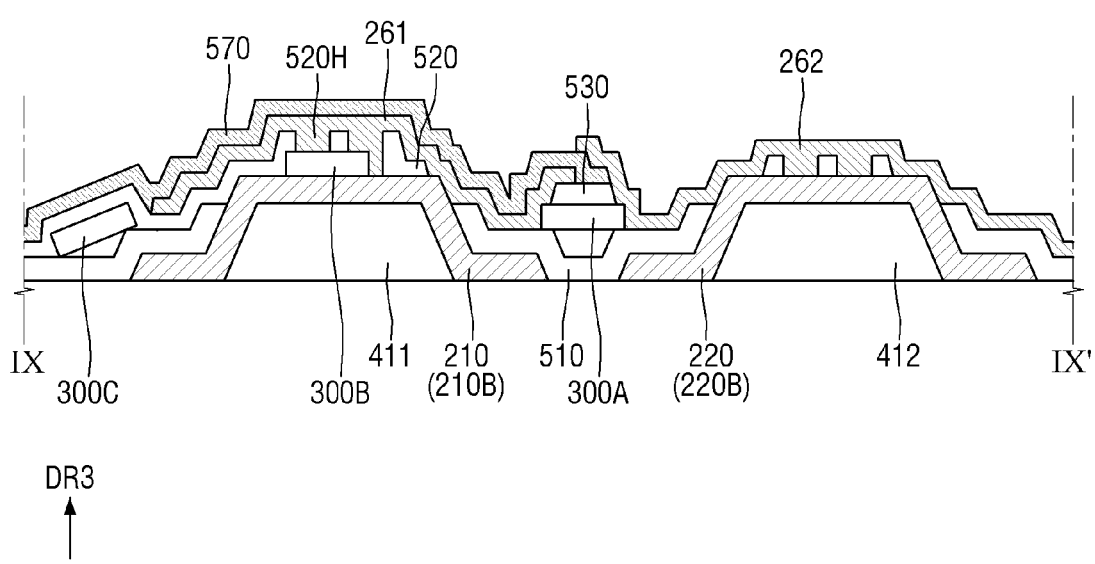
FIG. 11 is a schematic cross-sectional view taken along line IX-IX' of FIG. 7 in another embodiment.

FIG. 11 is a schematic cross-sectional view taken along line IX-IX' of FIG. 7 in another embodiment. The embodiment of FIG. 11 is different from the embodiment of FIG. 9 in that a fourth insulating layer 570 disposed on a first contact electrode 261 is further included.

Referring to FIG. 11, a display device 10 may further include the fourth insulating layer 570 disposed on the first contact electrode 261 and electrically insulating the first contact electrode 261 and a second contact electrode 262 from each other. The fourth insulating layer 570 may cover (or overlap) the first contact electrode 261 and may not overlap a part of a first light emitting element 300A so that the first light emitting element 300A can be connected to the second contact electrode 262. The fourth insulating layer 570 may contact (or partially contact) the first contact electrode 261 and the second contact electrode 262 on an upper surface of a third insulating layer 530. The fourth insulating layer 570 may be disposed on the third insulating layer 530 to cover (or overlap) an end of the first contact electrode 261. Accordingly, the fourth insulating layer 540 may protect the first contact electrode 261 while electrically insulating the first contact electrode 261 from the second contact electrode 262.

A side surface of the fourth insulating layer 570 in a direction in which the second contact electrode 262 is disposed may be aligned with a side surface of the third insulating layer 530, but embodiments are not limited to this case. In some embodiments, the fourth insulating layer 570 may include an inorganic insulating material, like a first insulating layer 510.

The first contact electrode 261 may be disposed between a first electrode 210 and the fourth insulating layer 570, and the second contact electrode 262 may be disposed on the fourth insulating layer 570. The second contact electrode 262 may partially contact the first insulating layer 510, the second insulating layer 520, the third insulating layer 530, the fourth insulating layer 570, a second electrode 220, and the light emitting element 300. An end of the second contact electrode 262 in a direction in which the first electrode 210 is disposed may be disposed on the fourth insulating layer 570.

A passivation layer 550 may be disposed on the fourth insulating layer 570 and the second contact electrode 262 to protect the fourth insulating layer 570 and the second contact electrode 262. Any redundant description is omitted below.

Figure 12:
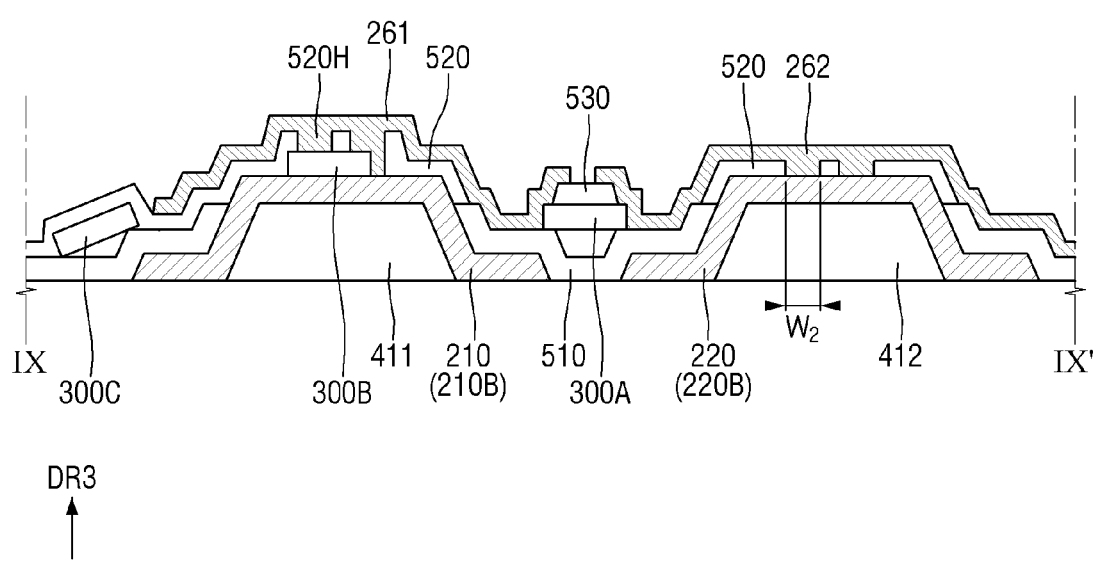
FIG. 12 is a schematic cross-sectional view taken along line IX-IX' of FIG. 7 in another embodiment.

FIG. 12 is a schematic cross-sectional view taken along line IX-IX' of FIG. 7 in another embodiment. The embodiment of FIG. 12 is different from the embodiment of FIG. 9 in that a second insulating layer 520 disposed on each electrode 210 or 220 is disposed up to an upper surface of each electrode 210 or 220 exposed by a first insulating layer 510.

Referring to FIG. 12, the second insulating layer 520 disposed on the electrodes 210 and 220 may be entirely disposed on upper surfaces of inner banks 411 and 412 and extend outward to overlap side surfaces of the inner banks 411 and 412 in the thickness direction DR3, respectively. The second insulating layer 520 may be disposed (or entirely disposed) on the electrodes 210 and 220 respectively disposed on the side surfaces of the inner banks 411 and 412 exposed by the first insulating layer 510. The first insulating layer 510 and the second insulating layer 520 may at least partially contact each other. Although the second insulating layer 520 overlaps a part of an upper surface of the first insulating layer 510 in the drawing, embodiments are not limited to this case. The second insulating layer 520 may also cover (or overlap) the upper surface of the first insulting layer 510 and at least a part of each side surface of the first insulating layer 510.

The first insulating layer 510 and the second insulating layer 520 may be interposed between the electrodes 210 and 220 and contact electrodes 261 and 262 to electrically insulate the electrodes 210 and 220 from the contact electrodes 261 and 262, respectively. However, the electrodes 210 and 220 may be in contact and/or be electrically connected with the contact electrodes 261 and 262, respectively, by contact holes 520H formed in the second insulating layer 520. Therefore, in this case, electrical signals may be transmitted from the electrodes 210 and 220 to a first light emitting element 300A through the contact electrodes 261 and 262, respectively.

Figure 13:
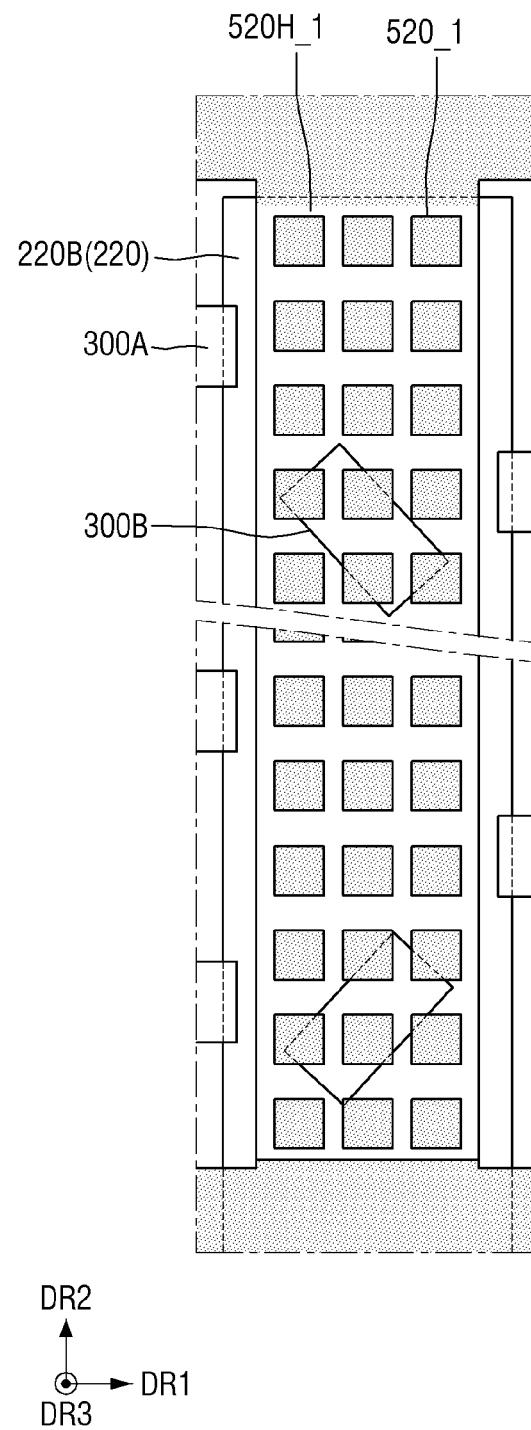
FIG. 13 is a schematic layout view illustrating relative positions of a second electrode branch, second light emitting elements, and a second insulating layer according to an embodiment.
Figure 14:
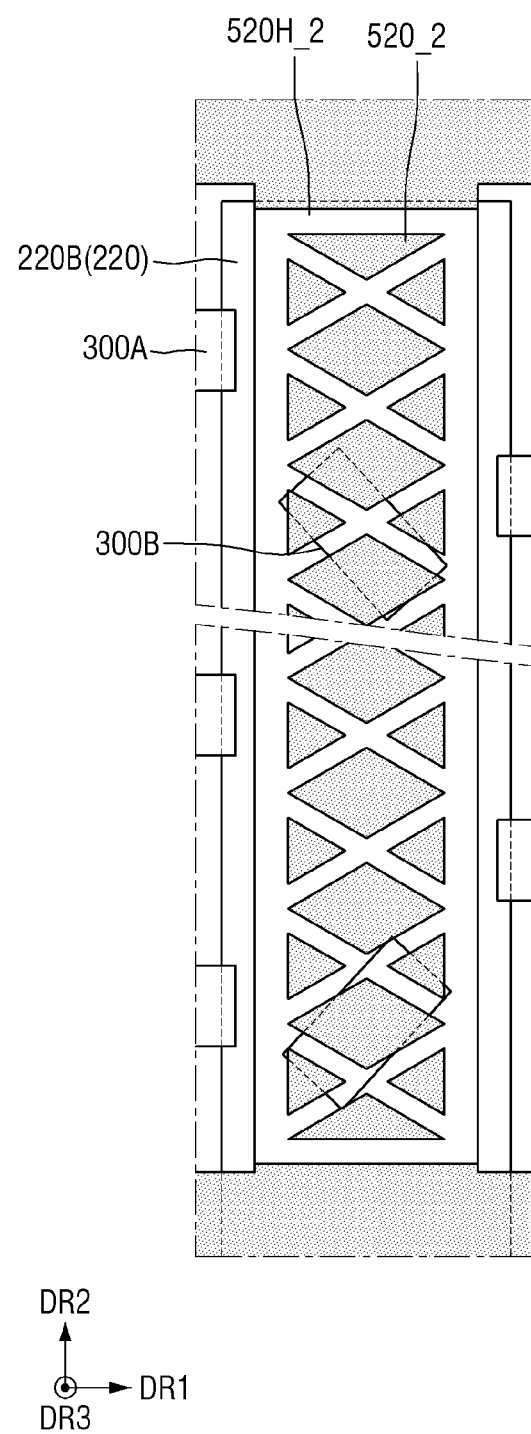
FIG. 14 is a schematic layout view illustrating relative positions of a second electrode branch, second light emitting elements, and a second insulating layer according to another embodiment.
Figure 15:
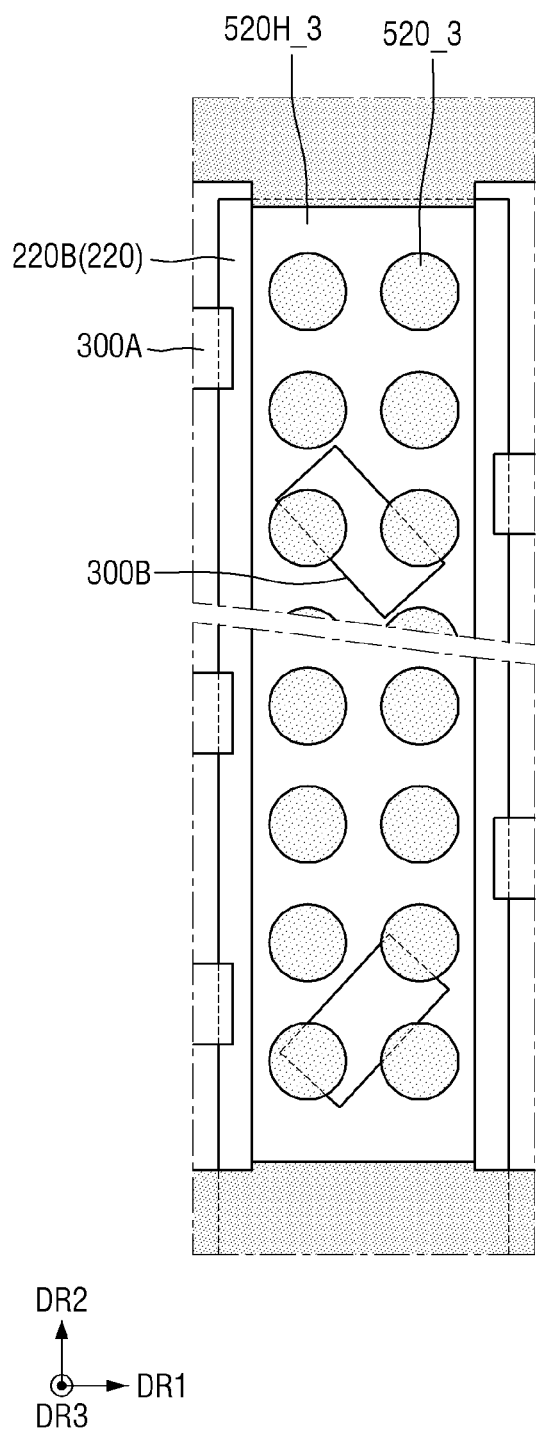
FIG. 15 is a schematic layout view illustrating relative positions of a second electrode branch, second light emitting elements, and a second insulating layer according to another embodiment.
Figure 16:
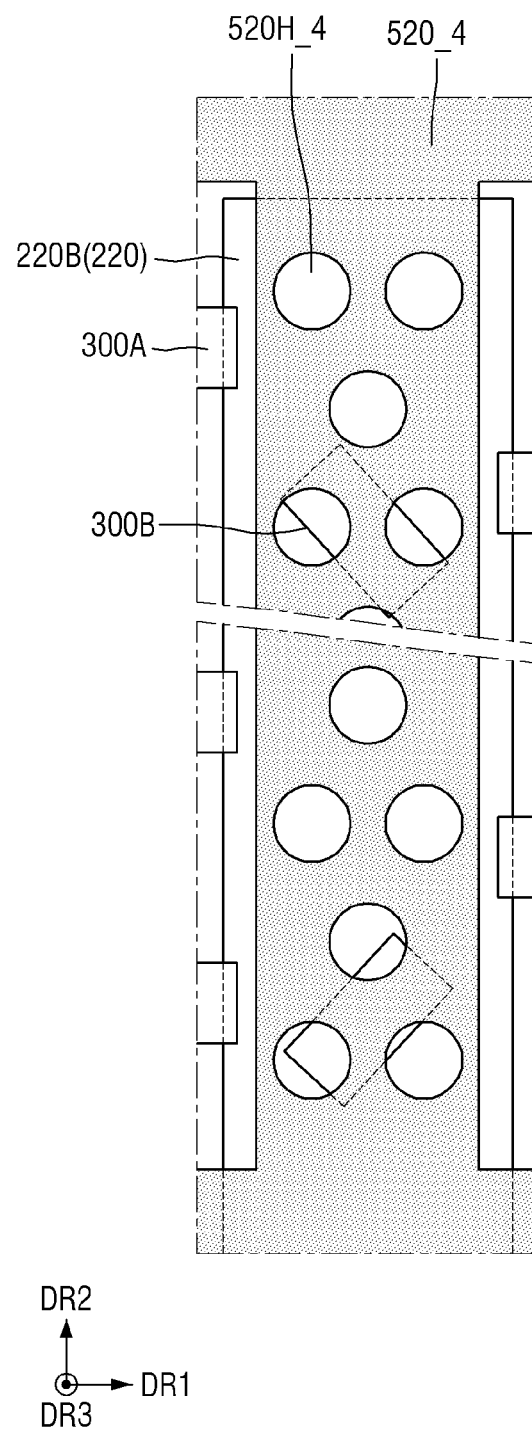
FIG. 16 is a schematic layout view illustrating relative positions of a second electrode branch, second light emitting elements, and a second insulating layer according to another embodiment.
Figure 17:
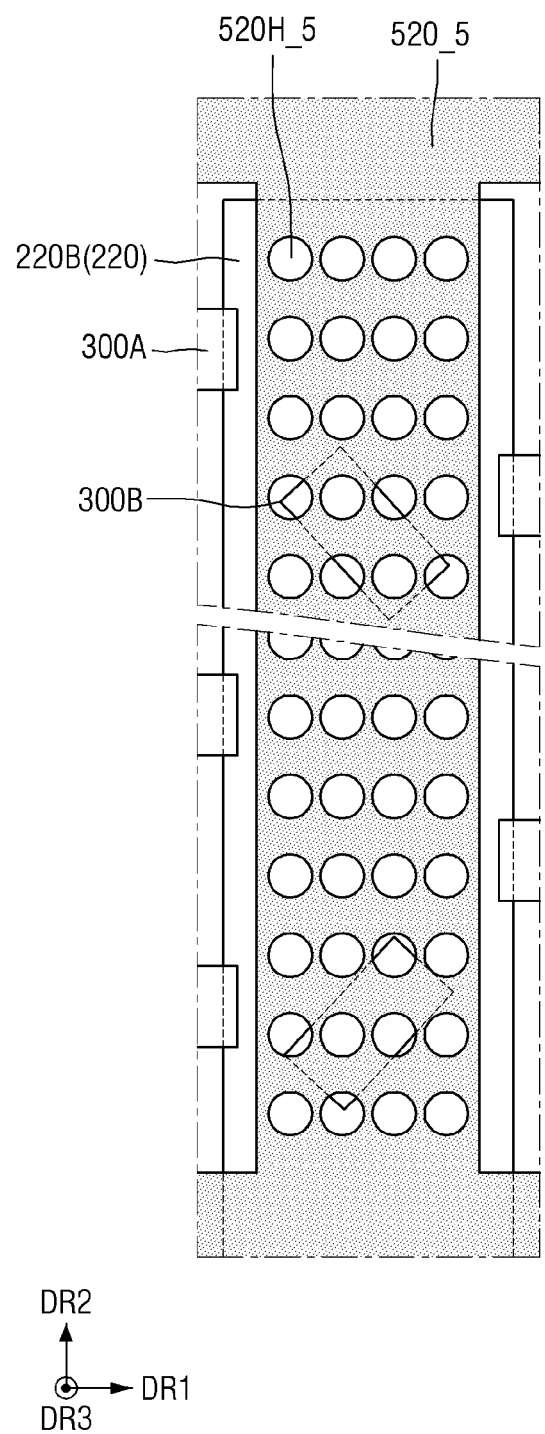
FIG. 17 is a schematic layout view illustrating relative positions of a second electrode branch, second light emitting elements, and a second insulating layer according to another embodiment.

FIG. 13 is a schematic layout view illustrating relative positions of a second electrode branch 220B, second light emitting elements 300B, and a second insulating layer 520_1 according to an embodiment. FIG. 14 is a schematic layout view illustrating relative positions of a second electrode branch 220B, second light emitting elements 300B, and a second insulating layer 520_2 according to another embodiment. FIG. 15 is a schematic layout view illustrating relative positions of a second electrode branch 220B, second light emitting elements 300B, and a second insulating layer 520_3 according to another embodiment. FIG. 16 is a schematic layout view illustrating relative positions of a second electrode branch 220B, second light emitting elements 300B, and a second insulating layer 520_4 according to another embodiment. FIG. 17 is a schematic layout view illustrating relative positions of a second electrode branch 220B, second light emitting elements 300B, and a second insulating layer 520_5 according to another embodiment.

FIGS. 13 through 17 show various embodiments of the shape of a contact hole formed in the second insulating layer disposed on the second electrode branch 220B (or a second electrode 220). The shape of the contact hole formed in the second insulating layer in the following embodiments is also applicable to a contact hole formed in the second insulating layer disposed on each first electrode branch 210B (or a first electrode 210).

Referring to FIG. 13, a contact hole 520H_1 formed in the second insulating layer 520_1 may be formed in a mesh structure. Therefore, the second insulating layer 520_1 disposed on each electrode 210 or 220 may be shaped like a plurality of square patterns in a plan view. However, embodiments are not limited to this case, and the second insulating layer 520_1 may also be shaped like rectangular patterns in a plan view. Even in this case, a width of the contact hole 520H_1, which is formed in a mesh structure, in the first direction DR1 and the second direction DR2 may be smaller than a length h of each light emitting element 300. Therefore, the second light emitting elements 300B can be prevented from moving to another member through the contact hole 520H_1.

Referring to FIG. 14, a contact hole 520H_2 formed in the second insulating layer 520_2 may extend in the second direction DR2 on both sides of each electrode 210 or 220 in the first direction DR1 and may further extend in an X shape between parts of the contact hole 520H_2 on both sides of the first direction DR1. Even in this case, a width of the contact hole 520H_2 may be smaller than a length h of each light emitting element 300. Therefore, the second light emitting elements 300B can be prevented from moving to another member through the contact hole 520H_2.

Referring to FIG. 15, contact holes 520H_3 of the second insulating layer 520_3 may have the same shape as an area excluding the contact holes 520H from the second insulating layer 520 of FIG. 7. The second insulating layer 520_3 may be shaped like circular patterns, each having a predetermined diameter. The diameter of each of the circular patterns constituting the second insulating layer 520_3 may be necessitated to be larger than a length h of each light emitting element 300 so that a plurality of second light emitting elements 300B can be fixed on each electrode 210 or 220 by the second insulating layer 520_3.

Referring to FIG. 16, contact holes 520H_4 disposed on the second insulating layer 520_4 may be arranged with two contact holes 520H_4 in the same odd-numbered row and one contact hole 520H_4 in the same even-numbered row. Even in this case, a diameter $W_2$ of each contact hole 520H_4 may be smaller than a length h of each light emitting element 300.

Referring to FIG. 17, a width of each contact hole 520H_5 disposed in the second insulating layer 520_5 may be smaller than that of each contact hole 520H disposed in the second insulating layer 520 according to the embodiment of FIG. 7. Although the width of each contact hole disposed in the second insulating layer 520_5 is small, the number of the contact holes 520H_5 arranged in the first direction DR1 and the second direction DR2 may be increased to increase a contact area between each contact electrode 261 or 262 and each electrode branch 210B or 220B (or each electrode 210 or 220).

Figure 18:
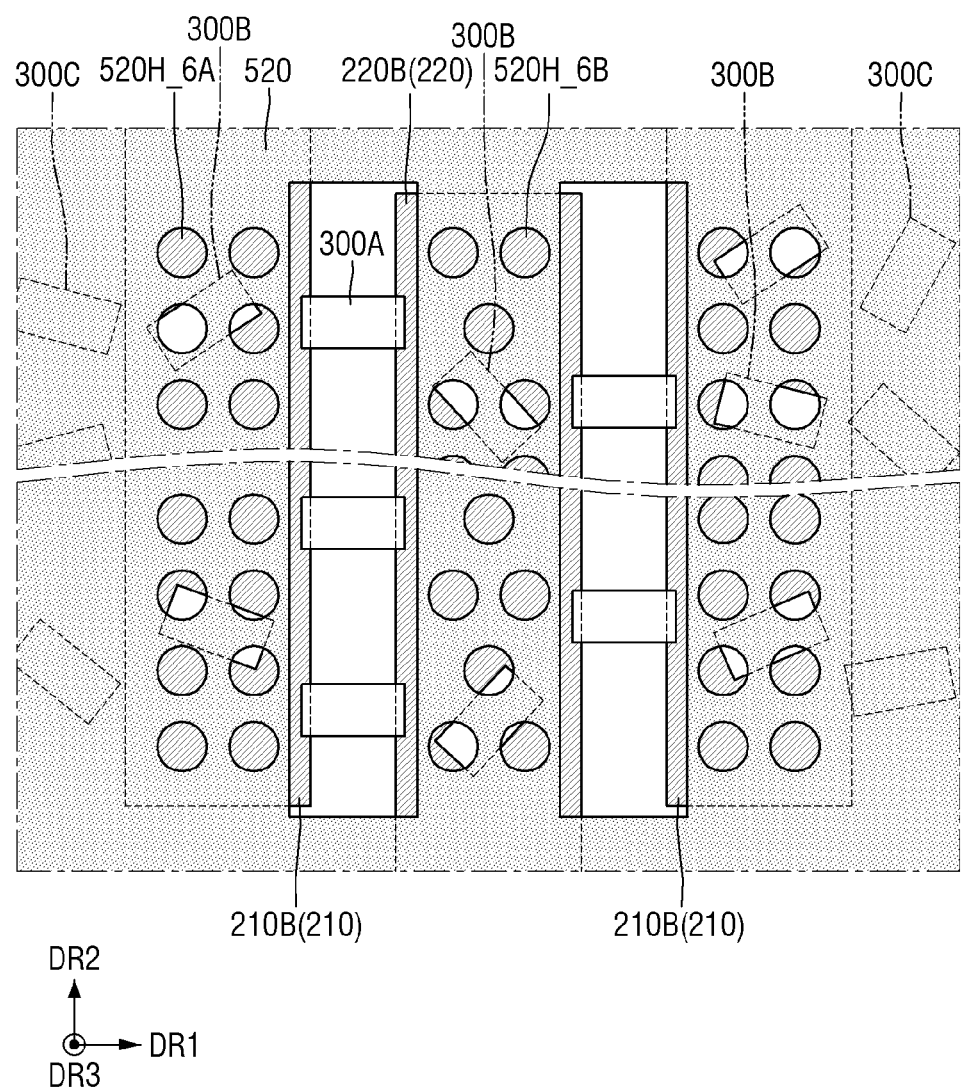
FIG. 18 is a schematic layout view illustrating relative positions electrodes, light emitting elements, and a second insulating layer in a sub-emission area of one subpixel according to an embodiment.

FIG. 18 is a layout view illustrating relative positions of electrodes 210 and 220, light emitting elements 300, and a second insulating layer 520 in a sub-emission area of one subpixel according to an embodiment.

Referring to FIG. 18, the embodiment of FIG. 18 is different from the embodiment of FIG. 7 in that patterns of contact holes 520H formed in the second insulating layer 520 disposed on each first electrode branch 210B are different from those of contact holes 520H formed in the second insulating layer 520 disposed on a second electrode branch 220B. The patterns of the contact holes 520H formed in the second insulating layer 520 disposed on each first electrode branch 210B may be the same as those of the embodiment of FIG. 7, and the patterns of the contact holes 520H formed in the second insulating layer 520 disposed on the second electrode branch 220B may be the same as those of the embodiment of FIG. 16. However, embodiments are not limited to this case, and the number and shape of the contact holes 520H formed in the second insulating layer 520 disposed on the electrode branches 210B and 220B disposed in a sub-emission area EMAn of one sub-pixel PXn may be different for each of the electrode branches 210B and 220B spaced apart from each other.

In concluding the detailed description, those skilled in the art will appreciate that many variations and modifications can be made to the embodiments without substantially departing from the principles. Therefore, the embodiments in disclosure are used in a generic and descriptive sense only and not for purposes of limitation.

What is claimed is:

1. A display device comprising:
   a first electrode and a second electrode disposed on a substrate and spaced apart from each other;
   a first light emitting element disposed between the first electrode and the second electrode;
   a second light emitting element disposed on the first electrode and spaced apart from the first light emitting element; and
   an insulating layer disposed on the first electrode and overlapping the second light emitting element, the insulating layer comprising at least one contact hole which penetrates the insulating layer to expose a part of the first electrode.

2. The display device of claim 1, wherein a length of the second light emitting element is greater than a diameter of the at least one contact hole.

3. The display device of claim 2, wherein
   the at least one contact hole includes a plurality of contact holes, and
   at least part of the plurality of contact holes overlap the second light emitting element.

4. The display device of claim 3, wherein the second light emitting element is electrically connected with the first electrode.

5. The display device of claim 4, wherein at least part of the second light emitting element directly contacts the first electrode.

6. The display device of claim 1, wherein
   the first light emitting element is electrically connected to the first electrode and the second electrode, and
   the second light emitting element is not electrically connected to the second electrode.

7. The display device of claim 6, further comprising:
   a first contact electrode electrically connected with an end of the first light emitting element and the first electrode; and
   a second contact electrode electrically connected with another end of the first light emitting element and the second electrode,
   wherein the first contact electrode is electrically connected with the first electrode through the at least one contact hole.

8. The display device of claim 7, wherein the second light emitting element includes:
   an end electrically connected with the first contact electrode; and
   another end contacting the insulating layer.

9. The display device of claim 1, wherein
   the first electrode includes a side facing the second electrode and another side opposite to the side,
   a third light emitting element is disposed at the another side of the first electrode, and the insulating layer overlaps the third light emitting element.

10. The display device of claim 9, wherein the third light emitting element is not electrically connected to the first electrode and the second electrode.

11. A display device comprising:
    a first electrode and a second electrode disposed on a substrate and spaced apart from each other;
    a first insulating layer overlapping at least part of each of the first electrode and the second electrode;
    a first light emitting element disposed between the first electrode and the second electrode;
    a second light emitting element disposed on the first electrode and spaced apart from the first light emitting element;
    a second insulating layer disposed on the first electrode and overlapping the second light emitting element, the second insulating layer comprising at least one first contact hole which penetrates the second insulating layer to expose a part of the first electrode; and
    a third insulating layer disposed on the first light emitting element and exposing at least part of the first light emitting element.

12. The display device of claim 11, further comprising:
    a first contact electrode electrically connected with an end of the first light emitting element and the first electrode; and
    a second contact electrode electrically connected with another end of the first light emitting element and the second electrode.

13. The display device of claim 12, wherein the second insulating layer further comprises at least one second contact hole which penetrates the second insulating layer to expose at least part of the second light emitting element.

14. The display device of claim 13, wherein a length of the second light emitting element is greater than a diameter of the at least one second contact hole.

15. The display device of claim 12, wherein
    the first insulating layer is disposed between the first electrode and the second electrode, and
    the first light emitting element is disposed on the first insulating layer.

16. The display device of claim 12, wherein
    at least part of the first insulating layer is disposed on the first electrode, and
    the second light emitting element is disposed on the first electrode.

17. The display device of claim 16, wherein the at least one first contact hole penetrates the first insulating layer to expose a part of the first electrode.

18. The display device of claim 12, wherein the second insulating layer is spaced apart from the first insulating layer.

19. The display device of claim 12, wherein the second insulating layer contacts at least part of the first insulating layer.

20. The display device of claim 11, wherein
    the first electrode includes a side facing the second electrode and another side opposite to the side,
    a third light emitting element is disposed at the another side of the first electrode, and
    the second insulating layer overlaps the third light emitting element.

21. The display device of claim 20, wherein the third light emitting element is not electrically connected to the first electrode and the second electrode.

* * * * *